United States Patent [19]
Shimizu et al.

[11] Patent Number: 5,633,069
[45] Date of Patent: May 27, 1997

[54] MULTILAYER PRINTED-CIRCUIT SUBSTRATE, WIRING SUBSTRATE AND PROCESS OF PRODUCING THE SAME

[75] Inventors: Masakazu Shimizu; Hiroshi Shimamura; Hidetaka Kumota, all of Kanagawa, Japan

[73] Assignee: Fuji Xerox Co., Ltd., Tokyo, Japan

[21] Appl. No.: 460,878

[22] Filed: Jun. 5, 1995

Related U.S. Application Data

[62] Division of Ser. No. 482,921, Feb. 22, 1990, abandoned.

[30] Foreign Application Priority Data

| Feb. 23, 1989 | [JP] | Japan | 1-44975 |
| Mar. 30, 1989 | [JP] | Japan | 1-76635 |
| Sep. 29, 1989 | [JP] | Japan | 1-252175 |

[51] Int. Cl.$^6$ .................................... B32B 3/00
[52] U.S. Cl. ............... 428/192; 428/195; 428/200; 428/201; 428/209; 428/457; 428/901
[58] Field of Search .................... 428/192, 195, 428/200, 201, 209, 457, 901

[56] References Cited

U.S. PATENT DOCUMENTS

| 4,687,695 | 8/1987 | Hamby ........................ 428/192 |
| 4,717,439 | 1/1988 | Hadju et al. ................. 156/280 |

FOREIGN PATENT DOCUMENTS 64-89586   4/1989   Japan.
64-89597   4/1989   Japan.

*Primary Examiner*—Patrick Ryan
*Assistant Examiner*—Elizabeth Evans
*Attorney, Agent, or Firm*—Finnegan, Henderson, Farabow, Garrett & Dunner, L.L.P.

[57] ABSTRACT

In a multilayer printed-circuit substrate comprising a plurality of insulating resin layers, a plurality of metal-made electrically conductive circuits respectively laminated between the insulating resin layers and on the upper surface of the uppermost-positioned insulating resin layer and electrically conductive portions for respectively electrically connecting adjacent upper- and lower-positioned conductive circuits to each other, the insulating resin layers except at least the lowest-positioned insulating resin layer have flexibility, and blackening-treated films prepared by applying blackening treatment to the surface of the respective electrically conductive circuits are respectively provided between the upper surfaces of the conductive circuits and the insulating resin layers laminated thereon. Also, a wiring substrate capable of being subjected to plastic work, comprises a sheet-like insulating base material made of hydrophilic high molecules capable of being plasticized when absorbing water and capable of being hardened when being dried, an insulating resin layer laminated on a surface of said insulating base material, and a metal-made electrically conductive circuit fixed to the insulating base material through the insulating resin layer.

6 Claims, 13 Drawing Sheets

MULTILAYER PRINTED-CIRCUIT SUBSTRATE, WIRING SUBSTRATE AND PROCESS OF PRODUCING THE SAME

This is a division of application Ser. No. 07/482,921, filed Feb. 22, 1990, now abandoned.

BACKGROUND OF THE INVENTION

The present invention relates to a multilayer printed-circuit substrate having a plurality of electrically conductive circuits laminated one on one through insulating resin layers interposed therebetween, and the process of producing such a multilayer printed-circuit substrate. The present invention also relates to a wiring substrate or a multilayer wiring substrate which is light in weight and which is excellent in insulation property and plastic working property such as bending, drawing and the like, and a process of producing the same.

In recent years, various kinds of electronic appliances have been improved in reduction of size, reduction of thickness and the like. With the improvements, increase of density and increase of layers have been demanded of printed-circuit substrates used in the electronic appliances. Therefore, various multilayer printed-circuit substrates have been proposed.

Such a multilayer printed-circuit substrate has a structure in which hard insulating sheets of glass epoxy, polyimide or the like forming electrically conductive circuits are stuck on each other and in which the electrically conductive circuits are connected to each other by through-hole plating, or has a structure in which a plurality of electrically conductive circuits are laminated one on one through insulating resin layers made of thermosetting resin such as polyimide resin, epoxy resin, melamine resin, urea resin or the like on the surface of a hard sheet-shaped reinforcement material and in which a protective resin layer may be provided to protect the uppermost-layer electrically conductive circuit if necessary.

On the other hand, the following methods are known as methods for producing such a multilayer printed-circuit substrate.

The first method is a method comprising the steps of: providing an insulating layer made of epoxy resin or the like on a metal sheet; laminating a first-layer electrically conductive circuit on the insulating layer, the circuit being made of copper foil or the like and formed to be a predetermined circuit pattern by etching or any other method; laminating an insulating layer having through holes on the first-layer electrically conductive circuit by solder resist printing or any other method; and forming a second-layer electrically conductive circuit by printing a predetermined circuit pattern on the insulating layer by use of electrically conductive paste or the like prepared by mixing carbon powder, copper powder, silver powder or the like, and at the same time, electrically connecting the first-layer and second-layer electrically conductive circuits to each other through the electrically conductive paste filled in the through holes of the insulating layer to thereby attain two layers.

The second method is a method for producing a so-called metal core substrate which comprises the steps of: applying perforating treatment to a metal sheet to thereby form through holes; coating the whole of the metal sheet, inclusive of the through holes, with an insulating layer made of epoxy resin or the like; and forming upper- and lower-surface electrically conductive circuits on the upper and lower surfaces of the insulating layer by plating or any other method, and, at the same time, electrically connecting the upper- and lower-surface electrically conductive circuits to each other through the through holes.

The third method is a method which comprises the steps of: laminating a first-layer electrically conductive circuit made of copper foil or the like on a side of an insulating sheet of polyimide resin, polyester resin or the like having heat resistance and insulating property; laminating an adhesive sheet on the other side of the insulating sheet; forming through holes for forming electrically conductive portions and feedthrough holes for mounting electronic parts; piling up and pressure-sticking the thus prepared laminate on a hard substrate of paper phenol, glass epoxy or the like having the first-layer electrically conductive circuit laminated through the adhesive sheet; electrically connecting the first- and second-layer electrically conductive circuits to each other through the through holes by soldering or any other method; and forming a cover layer on the not-yet-soldered portions by solder resist coat printing or any other method.

The fourth method is a method for producing a multilayer printed-circuit substrate having four-layer electrically conductive circuits, which comprises the steps of: laminating metal layers of copper foil or the like on the upper and lower sides of an insulating sheet of glass fiber fabric or the like impregnated with epoxy resin varnish or the like; forming feedthrough holes for performing positioning; forming at the same time electrically conductive circuits on the upper and lower sides thereof by an ordinary method to thereby prepare a double-side laminate; forming single-side laminates each having a metal layer on one side of an insulating sheet; pressure-sticking the single-side laminates on the double-side laminate through prepregs under application of heat and pressure to thereby increase the number of layers; forming feedthrough holes in the thus prepared multilayer matter; and forming electrically conductive circuits by applying through-hole plating to the feedthrough holes and the metal layers of the single-side laminates and by etching the metal layers to form predetermined circuit patterns.

However, the first method has a problem in which the electrically conductive paste is so inferior in moisture-resisting and heat-resisting property that the resistance value of the electrically conductive circuits varies widely corresponding to the change of the outside temperature and humidity, and in which it is difficult to make the substrate fine so that reliability deteriorates when long electrically conductive circuits are formed.

The second method has a problem in which the steps for forming the insulting layers and electrically conductive circuits are so complex that producing cost becomes high.

The third method has a problem in which the producing steps are so complex that cost increases because the sticking step using the adhesive sheet and the handwork step for soldering are required, and in which when an easy pressure-sensitive adhesion type adhesive sheet is used as the adhesive sheet, peeling of the adhesive portions and cracking of the solder connection portions occur so easily that reliability deteriorates.

The fourth method has a problem in which the epoxy resin used is so inferior in heat-resisting property that a so-called smear phenomenon that the epoxy resin is softened by heat at the time of forming feedthrough holes by using a drill or the like and enters into the feedthrough holes to cover the cutting surfaces of the metal layers occurs and, accordingly, connection between the respective electrically conductive circuits with the use of the cutting surfaces of the metal layers exposed into the feedthrough holes by through-hole plating means becomes insufficient or a so-called internal layer peeling phenomenon occurs to increase the number of defective products.

Therefore, the inventors have proposed a multilayer printed-circuit substrate and a method of producing the same to solve the aforementioned problems. The proposed multilayer printed-circuit substrate has a hard sheet-shaped reinforcement material, a plurality of insulating resin layers laminated on a surface of the hard material and hardened at the time of pressure-sticking under application of heat and pressure, a plurality of metal-made electrically conductive circuits laminated between the insulating resin layers and on the uppermost thereof and etched to predetermined circuit patterns, and electrically conductive portions for electrically connecting adjacent upper- and lower-positioned electrically conductive circuits to each other by filling an electrically conductive matter in holes formed to pass through the upper-positioned electrically conductive circuits at predetermined positions between the adjacent upper- and lower-positioned electrically conductive circuits and pass through the insulating resin layers located between the upper- and lower-positioned electrically conductive circuits. The proposed method for producing such a printed-circuit substrate is a method of laminating a plurality of electrically conductive circuits through insulating layers on a hard sheet-shaped reinforcement material, which comprises the steps of: forming a half-hardened insulating resin sheet having metal-made electrically conductive circuits laminated on the upper surface thereof and showing a stable half-hardened condition; laminating the half-hardened insulating resin sheet on lower-positioned electrically conductive circuits laminated through a hard sheet-shaped reinforcement material or through insulating resin layers hardened at the time of pressure-sticking under application of heat and pressure; hardening the half-hardened insulating resin of the half-hardened insulating resin sheet by pressure-sticking under application of heat and pressure; and forming electrically conductive portions for electrically connecting adjacent upper- and lower-positioned electrically conductive circuits to each other by filling an electrically conductive matter in feedthrough holes formed in the upper-positioned electrically conductive circuits and the insulating layers to reach the lower-positioned electrically conductive circuits (Japanese Patent Application Nos. 62-246,892 and 62-246, 893). According to the proposed printed-circuit substrate and the method of producing the same, the thus prepared printed- circuit substrate is excellent in heat-resisting property and durability against solvent and excellent in reliability because the failure of electrical connection caused by the smear phenomenon at the time of through-hole plating little occurs. Further, the producing steps are simplified to attain saving of producing cost.

However, in the proposed multilayer printed-circuit substrate, irregularity may occur in adhesion between the respective electrically conductive circuit and the insulating resin layer covering thereon though the degree of irregularity varies according to the kind of the metal forming the electrically conductive circuit and the kind of the resin forming the insulating resin layer. Accordingly, in the case where heat stress caused by soldering or the like acts or in the case where heat stress caused by the exchange of parts acts repeatedly, swelling or peeling may occur between the electrically conductive circuit and the insulating resin layer covering thereon. Accordingly, failure of electric conduction may occur. In particular, in the case where the exchange of parts is repeated, reliability may deteriorate.

Further, the aforementioned problems arise not only in the multilayer printed-circuit substrate having such stiffness but in the case where a flexible multilayer printed-circuit substrate having flexibility such as for example two-layer structure designed to attain high density to put electronic parts in the limited space of electronic appliances in which both reduction of size and reduction of thickness are required is bent in practical use.

In short, the conventional flexible multilayer printed-circuit substrate has a structure, as shown in FIG. 1, substantially constituted by a lower-positioned laminate X and an upper- positioned laminate Y, the lower-positioned laminate X being formed by sticking copper foil to a flexible insulating sheet 101a, such as a polyester sheet, a polyimide sheet or a glass epoxy sheet having a thickness of 0.2 mm or less, and then applying an etching treatment to the copper foil to prepare an electrically conductive circuit 102a, the upper-positioned laminate Y being formed to have an insulating sheet 101b and an electrically conductive circuit 102b in the same manner as the lower-positioned laminate, the upper-positioned laminate Y being provided with feedthrough holes 103 formed by applying a perforating treatment to a predetermined position of the upper-positioned laminate Y, the upper-positioned laminate Y being laminated onto the lower-positioned laminate X by heat-pressing means or the like through an adhesive agent layer made of a thermosetting adhesive agent such as an epoxy resin or the like or a thermoplastic adhesive agent such as an acrylic resin, the electrically conductive circuits 102a and 102b of the upper- and lower-positioned laminates X and Y being electrically connected to each other by using the feedthrough holes 103 formed in the upper-positioned laminate Y, the upper-positioned laminate being provided with a protective film 106 formed by applying a so-called cover layer, such as a film or a solder resist, of the same material as that of the insulating sheets 101a and 101b to other portions of the upper- positioned laminate which are not soldered.

However, in the thus prepared flexible multilayer printed-circuit substrate, the laminates B1 and B2 are laminated through the adhesive agent layer 104. Accordingly, in the case where the adhesive agent layer 104 is formed of a thermosetting adhesive agent, cost required for the adhesive agent is high. Further, a problem arises in that the step of application of the adhesive agent requires much labor. In the case where the adhesive agent layer 104 is formed of a thermoplastic adhesive agent, the adhesive agent is so inferior in heat-resisting property that cracking is apt to occur in the solder portions. Therefore, the soldering step must be conducted by handwork in order to prevent the lowering of reliability. Further, a problem arises in that the adhesive property thereof is so inferior that peeling is apt to occur. In any case, a problem arises in that the producing cost is too high to produce a reliable flexible multilayer printed-circuit substrate.

On the other hand, as a base material of a wiring substrate used in various electronic appliances, heretofore, rigid insulating sheets having stiffness, such as glass, ceramics, glass epoxy, and the like, have been generally used. In general, this type wiring substrate is shaped like a flat sheet and used after being put in a substrate packing space formed in the inside of electronic appliances.

However, such a wiring substrate is inferior in plasticity. Therefore, in the case such a wiring substrate cannot be used in the form of a single flat substrate for some reason or more of the substrate packing space provided in electronic appliances, it is necessary to employ a structure of divisional connection in which the substrate is divided into several members which are connected by use of cables or connectors. This type wiring substrate has a problem in that the number of parts is inevitably increased, and, accordingly, this type wiring substrate cannot sufficiently cope with the demands for reduction of size, reduction of weight, reduction of thickness, and the like, in some electronic appliances.

In recent years, the following wiring substrates have been proposed to cope with the recent demands for reduction of size, reduction of thickness, and the like. One of the proposed wiring substrates is a wiring substrate called "a metal base substrate" which has a metal sheet 201 such as an aluminum sheet, a steel sheet, or the like used as a base material, and an electrically conductive circuit 203 laminated on the metal sheet through an insulating layer 202 of insulating resin, such as epoxy resin, glass epoxy, polyimide, polyamide, or the like, and formed by applying etching treatment to copper foil or the like to attain a predetermined circuit pattern, as shown in FIG. 2. Another one of the proposed wiring substrates is a wiring substrate called "a metal core substrate" which is prepared by the steps of: forming through holes 204 in a metal sheet 201; coating the whole surface, inclusive of the inside of the through holes 204, with an insulating layer 202 of insulating resin such as epoxy resin or the like to prepare through holes 105 coated with the insulating layer 202; and forming an electrically connection portion 206 for connecting between electrically conductive circuits 203a and 203b laminated on the double sides of the metal sheet through the insulating layer 202, as shown in FIG. 3.

Such a wiring substrate having the metal sheet 201 as a base material has an advantage in that the degree of freedom in the formation of the substrate packing space provided in electronic appliances increases, because the wiring substrate is excellent in strength and plastic working property so that the the wiring substrate can be suitably bent or drawn so as to have a predetermined shape in accordance with the requirement of electronic appliances.

Even in such a wiring substrate having the metal sheet 201 as a base material, there is a problem in that corner portions of the insulating layer 202 are apt to be injured at the time of plastic work or practical use to thereby lower reliability upon insulation. Furthermore, in the case of the metal core substrate, the whole surface inclusive of the inside of the through holes 204 must be entirely coated with the insulating layer 202. There arises a problem in that much labor is required for the coating work.

Accordingly, the metal base substrate and the metal core substrate have, limitation in that no portion except non-wiring portions can be subjected to plastic work. Furthermore, it is difficult to make the substrates have a multilayer structure for the purpose of high density. In short, it cannot be said that the conventional substrates are sufficient for development in reduction of size, reduction of thickness, reduction of weight, and the like, of electronic appliances.

SUMMARY OF THE INVENTION

An object of the present invention is to provide a multilayer printed-circuit substrate which is free from the necessity of providing the aforementioned adhesive agent layer, excellent in heat-resisting property, free from the occurrence of interlayer swelling or peeling, excellent in adhesion between the respective electrically conductive circuit and the insulating resin layer covering thereon and high in reliability.

Another object of the invention is to provide a multilayer printed-circuit substrate which is so excellent in adhesion between the electrically conductive circuit and the insulating resin layer covering thereon that there is no occurrence of swelling or peeling between the electrically conductive circuit and the insulating resin layer even in the case where heat stress caused by soldering or the like acts repeatedly on the substrate, and that high reliability is attained even in the case where the exchange of parts is repeated.

A further object of the invention is to provide a method for producing a multilayer printed-circuit substrate, by which a multilayer printed-circuit substrate excellent in heat-resisting property, durability against repeated action of heat stress and reliability against the exchange of parts can be produced simply and easily.

A still another object of the present invention is to provide a wiring substrate which is light in weight, which is excellent in reliability upon insulation, and which can be subjected to plastic work, through bending, drawing or any other means, in accordance with the shape of the substrate packing space required by various electronic appliances, and is provided a process for producing such a wiring substrate.

A still further object of the invention is to provide a wiring substrate which is light in weight and excellent in reliability upon insulation, and which has a curve portion formed through plastic work by bending, drawing or any other means, and, accordingly, has a shape which is in accord with the shape of the substrate packing space in electronic appliances.

According to a first aspect of the present invention, in a multilayer printed-circuit substrate having a plurality of insulating resin layers, having a plurality of metal-made electrically conductive circuits respectively laminated between the insulating resin layers and on the upper surface of the uppermost-positioned insulating resin layer and etched so as to form predetermined circuit patterns, and having electrically conductive portions for respectively electrically connecting adjacent upper- and lower-positioned conductive circuits to each other at predetermined positions of the upper- and lower-positioned conductive circuits, the improvement is that all the insulating resin layers except at least the lowest-positioned insulating resin layer have flexibility, and that blackening-treated films prepared by applying blackening treatment to the surfaces of the respective electrically conductive circuits are respectively provided between the upper surfaces of the conductive circuits and the insulating resin layers laminated thereon.

According to a second aspect of the present invention, in a process for producing a multilayer printed-circuit substrate having the steps of: forming a plurality of laminates each having a half-hardened insulating resin sheet showing a stable half- hardened condition and a metal-made electrically conductive circuit laminated on the upper surface of the insulating resin sheet and etched so as to form a predetermined circuit pattern; and forming electrically conductive portions for electrically connecting adjacent upper- and lower-positioned ones of the electrically conductive circuits while laminating the laminates by piling up one on one, pressure-sticking them to each other under application of heat and pressure and hardening the half-hardened insulating resin of the half-hardened insulating resin sheets, thus laminating the plurality of electrically conductive circuits through the resin layers, the improvement is that before each half-hardened insulating resin sheet having the upper-positioned electrically conductive circuit is piled up on the lower-positioned electrically conductive circuit so that the thus piled up laminate is pressure-stuck under application of heat and pressure, the lower-positioned electrically conductive circuit is subjected to blackening treatment so that a blackening-treated film is formed on the surface of the lower-positioned electrically conductive circuit.

According to a third aspect of the present invention, a plastic wiring substrate capable of being subjected to plastic work, comprises: a sheet-like insulating base material made of hydrophilic high molecules capable of being plasticized when the hydrophilic high molecules absorb water and capable of being hardened when the hydrophilic high molecules are dried; an insulating resin layer laminated on a surface of the insulating base material; and a metal-made electrically conductive circuit fixed to the insulating base material through the insulating resin layer and etched to form a predetermined circuit pattern. Preferably, the wiring substrate has a predetermined curve portion formed through plastic work. The present invention is directed also to a process for producing such a wiring substrate as described above.

According to a fourth aspect of the present invention, a multilayer wiring substrate, capable of being subjected to plastic work, comprises: a sheet-like insulating base material made of hydrophilic high molecules capable of being plasticized when the hydrophilic high molecules absorb water and capable of being hardened when the hydrophilic high molecules are dried; a plurality of insulating resin layers laminated on a surface of the insulating base material and hardened at the time of pressure-sticking under application of heat and pressure; a plurality of metal-made electrically conductive circuits disposed between and on the upper surfaces of the insulating resin layers and etched to form predetermined circuit patterns respectively; and current conduction portions passing through the insulating resin layers at predetermined positions between the electrically conductive circuits so as to electrically connect the electrically conductive circuits to each other. Preferably, the multilayer wiring substrate has a predetermined curve portion formed through plastic work. The present invention is directed also to a process for producing such a multilayer wiring substrate as described above.

DETAILED DESCRIPTION OF THE INVENTION

Figure 1:
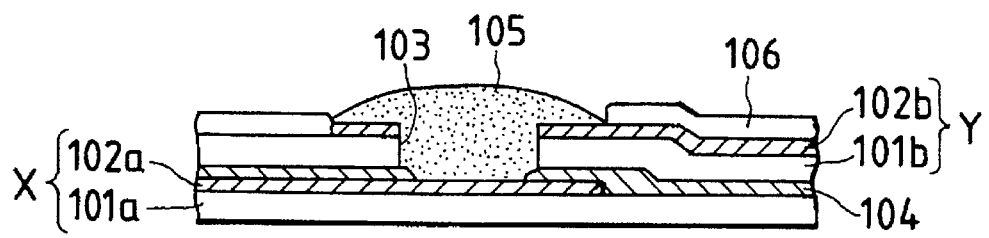
FIG. 1 is an explanatory sectional view showing a conventional flexible multilayer printed-circuit substrate.
Figure 2:
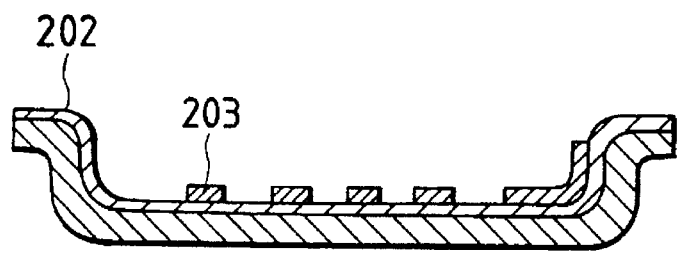
FIGS. 2 and 3 are explanatory sectional views respectively showing conventional wiring substrates using a metal sheet.
Figure 3:
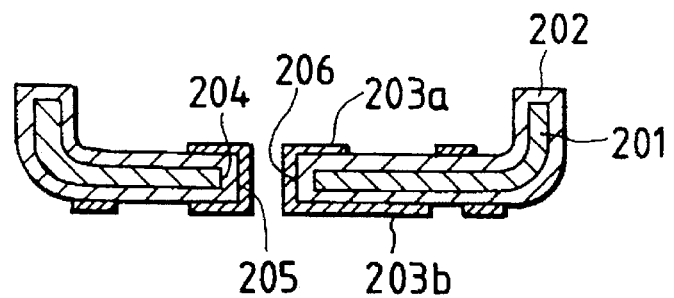

The present invention will be described in more detail.

In a multilayer printed circuit substrate of the present invention, any known material may be used as an insulating resin showing a stable half-hardened state and forming the insulating resin layer by hardening at the time of pressure-sticking under application of heat and pressure, if the material has a predetermined degree of flexibility in the form of a sheet of the thickness of 0.5 mm or less, preferably, 0.2 mm or less and has durability against chemical treatment such as etching, blackening, and the like. Preferred examples are materials prepared by impregnating flexible sheets, such as aromatic polyamide nonwoven fabric, glass fiber fabric, and the like, with thermosetting resin, such as polyimide resin, diallyl phthalate resin, epoxy resin, melamine resin, urea resin, and the like. More preferred examples are materials prepared by impregnating flexible sheets with diallyl phthalate resin, such as diallyl terephthalate, diallyl isophthalate, diallyl orthophthalate, and the like, showing a stable half-hardened state. In respect to the materials prepared by impregnating flexible sheets with diallyl phthalate resin, other materials such as unsaturated polyester, epoxy resin, and the like, prepared by ordinary dehydrocondensation of an acid component containing a saturated dibasic acid component, such as terephtal acid and/or isophthalic acid, and a normal α,β-dibasic acid component and a glycol component may be added to the materials for the purpose of improvement in alkali resistance, flexibility and the like. The thickness of the insulating resin layer can be changed suitably based on the judgment as to whether stiffness should be given to the produced multilayer printed-circuit substrate or whether flexibility should be given to the substrate. Further, in respect to the insulating resin forming the insulating layers, one and the same resin may be used in all the insulating resin layers or various resins different from each other may be used suitably in the insulating resin layers.

Further, the preferred example of the metal laminated between the insulating resin layers and the uppermost surface thereof and etched into predetermined circuit patterns to form electrically conductive circuits is copper foil, such as electrolytic copper, rolled copper, and the like, generally used in this type printed-circuit substrate. Metal materials, such as aluminum foil, phosphobronze foil, stainless steel foil, iron foil, nickel foil, and the like, capable of being etched to predetermined circuit patterns may be used in the uppermost layer having no necessity of blackening treatment. The thickness of the respective metal-made electrically conductive circuit is generally 100 μm or less, preferably, 35 μm or less.

The means for forming electrically conductive portions for electrically connecting adjacent upper- and lower-positioned electrically conductive circuits is not limited specifically and any known method may be used. Preferred examples of the method include a method for forming electrically conductive portions for electrically connecting the upper- and lower-positioned electrically conductive circuits to each other by filling an electrically conductive matter in feedthrough holes passing through the upper-positioned laminate to reach the electrically conductive circuits of the lower-positioned laminate, and a method using a jumper or the like to solder one end thereof to the electrically conductive circuit of the upper-positioned laminate and solder the other end to the electrically conductive circuit of the lower-positioned laminate. The electrically conductive matter used in the aforementioned method is not limited specifically. Preferred examples of the electrically conductive matter on the consideration of maintenance of stability of electrical connection and handling property at the time of production include electrically conductive paste such as copper, silver, carbon, and the like, solder, and the like.

Further, according to the present invention, suitable stiffness or flexibility can be given to the multilayer printed-circuit substrate corresponding to the purpose of use. In short, desired stiffness or suitable flexibility can be given to the multilayer printed-circuit substrate of the invention by changing the thickness of the lowermost insulating layer.

In the case where stiffness or flexibility is given to the lowermost insulating resin layer, a material different from the material used in upper-positioned insulating layers may be used if the material has durability against chemical treatment such as etching, blackening, and the like. When, for example, stiffness is given, a known material, such as paper phenol, glass epoxy, and the like, having a thickness of about 0.3 to about 3.2 mm can be used. When, for example, suitable flexibility is given, a known material, such as polyimide, polyester, polyether sulfone, and the like, having a thickness of about 0.05 to about 0.2 mm can be used. Further, desired stiffness or suitable flexibility can be given by laminating a flexible sheet-shaped reinforcement material, such as unsaturated polyamide nonwoven fabric, glass fiber fabric, and the like, on the lower surface side. In the case where stiffness is partly given as a known hard flexible substrate, known hard sheet-shaped reinforcement materials, such as hard insulating sheets of paper phenol, glass epoxy, and the like, metal sheets of iron, aluminum, and the like, may be laminated.

According to the present invention, blackening-treated films prepared by applying blackening treatment to the surfaces of the electrically conductive circuits are provided between the upper surfaces of the respective electrically conductive circuits and the insulating resin layers laminated thereon. The blackening-treated films may be formed by applying blackening treatment to the surfaces of the metal-made electrically conductive circuits by using a blackening treatment solution prepared by dissolving sodium chlorite, sodium hydroxide and trisodium phosphate in predetermined concentrations.

The method for producing the multilayer printed-circuit substrate of the invention, comprises the steps of: forming a plurality of laminates each having a half-hardened insulating resin sheet showing a stable half-hardened state and an electrically conductive circuit of metal laminated on the upper surface thereof and etched to form a predetermined circuit pattern; forming blackening-treated films on the surfaces of electrically conductive circuits of lower-positioned laminates by applying blackening treatment to the electrically conductive circuits of the lower-positioned laminates in adjacent upper- and lower-positioned laminates; laminating the upper- and lower- positioned laminates through piling up the upper- and lower- positioned laminates to each other, pressure-sticking them to each other under application of heat and pressure and hardening the half-hardened insulating resin of the half-hardened insulating resin sheet; and forming electrically conductive portions for electrically connecting the upper- and lower-positioned electrically conductive circuits.

The method of the invention will be described more specifically with reference to FIGS. 4–9.

Figure 4:
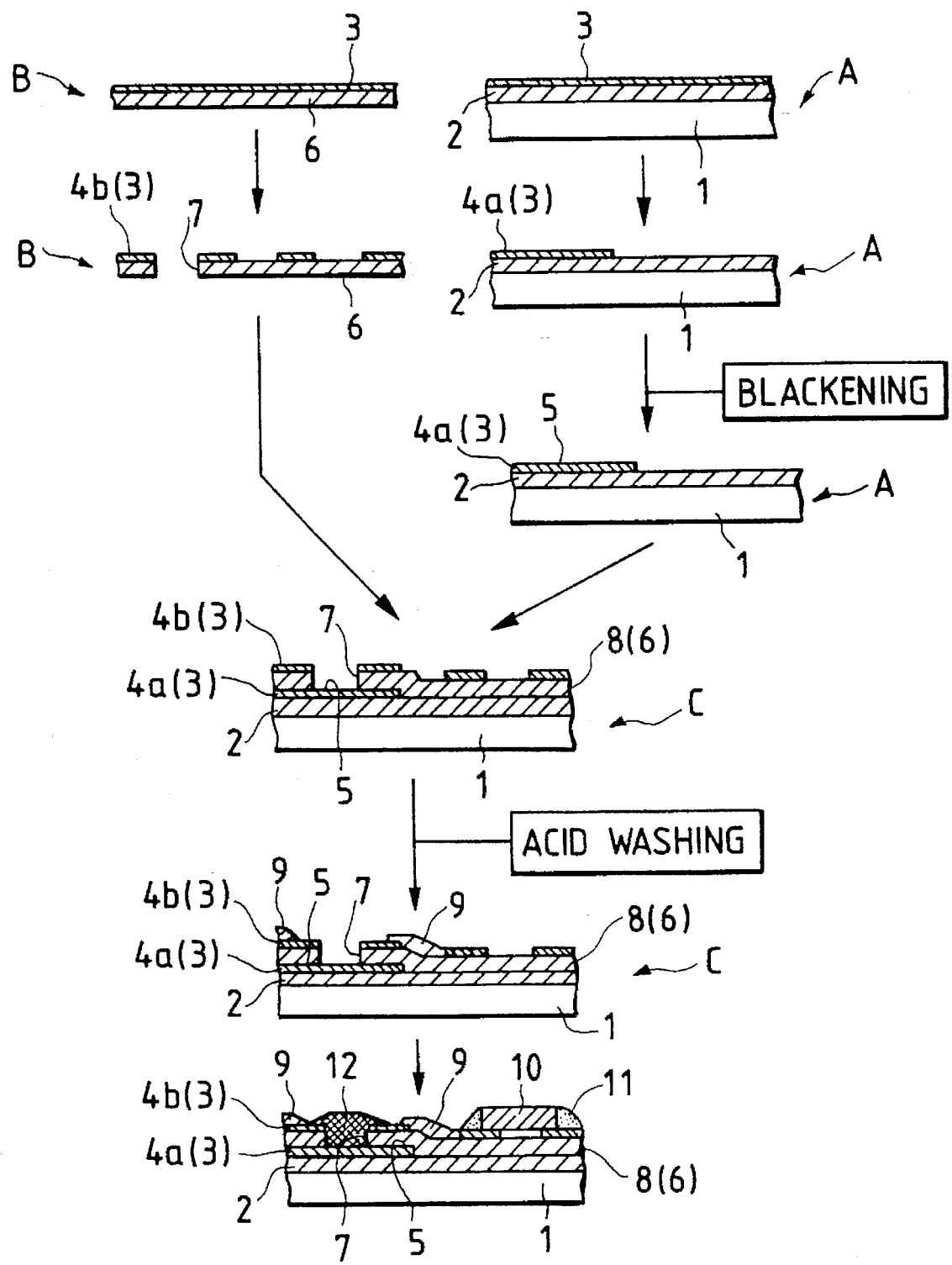
FIGS. 4 through 6 are explanatory sectional views showing an example of a process for producing a multilayer printed-circuit substrate having stiffness according to the present invention.

FIG. 4 shows an example in which a multilayer printed-circuit substrate having stiffness and having a hard sheet-shaped reinforcement material laminated on the lower surface side of the lowermost insulating resin layer is produced.

In short, a metal layer 3 made of copper foil or the like is laminated on the upper surface of a hard sheet-shaped reinforcement material 1 made of a metal sheet or the like, through an insulating resin layer made of epoxy resin, polyimide resin or the like and having a thickness of 0.01 to 0.2 mm to thereby prepare a laminate A. In respect to the laminate A, the metal layer 3 is etched to a predetermined circuit pattern to prepare a lower-layer electrically conductive circuit 4a. A known method using cupric chloride, ferric chloride or the like may be used in the etching step. For example, the surface of the metal layer 3 is degreased. Then, a circuit pattern is formed by screen printing with the use of an etching resist of alkali-soluble antiacid ink. Then, the metal layer was dried and etched by a ferric chloride solution. Then, the resist is separated by an alkali solution of sodium hydroxide or the like. The solution was neutralized with an acid solution of sulfuric acid or the like. The metal layer is washed with water and dried.

The laminate A having the lower-layer electrically conductive circuit 4a laminated as described above is then subjected to blackening treatment in which a blackening-treated film 5 is formed on the whole surface of the electrically conductive circuit 4a. A known method may be used in the blackening treatment. For example, a blackening treatment solution obtained by dissolving in water 5 to 8% by weight of a mixture of 50 to 80 parts by weight of sodium sulfite, 10 to 26 parts by weight of sodium hydroxide and 10 to 24 parts by weight of trisodium phosphate is prepared. The blackening treatment is performed through the steps of: performing surface polishing by buffing or the like; performing alkali degreasing or deceasing by acid cleaner; performing washing with water such as hot water, flowing water or the like; performing soft etching by a mixture solution of sulfuric acid and hydrogen peroxide or an ammonium persulfate solution; performing washing with flowing water by twice; performing immersing in acid such as sulfuric acid or hydrochloric acid; performing washing with flowing water by twice; performing immersing in the blackening treatment solution under the condition of 80° to 98° C. and 1 to 4 minutes; performing washing with water such as hot water or flowing water by twice or three times; performing draining and drying by air dryer or dryer; and performing drying under the condition of 120°±10° C. and one hour or more.

On the other hand, a metal layer 3 is stuck to a half-hardened insulating resin sheet 6 obtained by impregnating a flexible sheet such as aromatic polyamide nonwoven fabric, glass fiber fabric or the like with a diallyl phthalate resin composition to thereby prepare a laminate B. The metal layer 3 of the laminate B is etched in the same manner as described above to prepare an upper-layer electrically conductive circuit 4b. Further, holes 7 used for electrically connecting the upper- and lower-layer electrically conductive circuits to each other are formed in the metal layer 3 of the laminate B.

The thus prepared laminate B is piled up on the laminate A and pressure-stuck under application of heat and pressure to unite the laminates A and B into one body. At the same time, the half-hardened resin of the half-hardened insulating resin sheet 6 of the laminate B is hardened to prepare a laminate C having the upper- and lower-layer electrically conductive circuits 4a and 4b. The condition for application of heat and pressure at the time of the pressure-sticking varies according to the thickness of the half-hardened insulating resin sheet 6 and the kind of the half-hardened resin used therein. The heating condition is not limited so long as the temperature is within the range of the heat-resisting temperature of the laminate A and can harden the half-harden resin to change the half-hardened insulating resin sheet 6 to the insulating resin layer 8 to thereby stick the laminates A and B to each other. The pressure condition is not limited so long as the blackening-treated film 5 and insulating resin layer 2 of the laminate A can be stuck closely to the half-hardened insulating resin sheet 6 of the laminate B to keep a state in which no bubble remains between the blackening-treated film 5 or insulating resin layer 2 and the insulating resin layer 8 after hardening. When, for example, the half-hardened insulating resin sheet 6 is prepared by impregnating a flexible sheet of aromatic polyamide nonwoven fabric with a diallyl phthalate resin composition or the like, the conditions are the temperature of 140° to 180° C., the pressure of 30 to 60 kg/cm$^2$.G and the period of 10 to 60 minutes.

The laminate C is immersed in an acid solution such as a sulfuric acid solution or a hydrochloric acid solution to dissolve the blackening-treated film 5 exposed at the bottom of the holes 7 and remove it. The condition for the acid washing treatment is not limited specifically so long as the blackening- treated film 5 exposed at the bottom of the holes 7 can be dissolved and removed. To prevent unnecessary corrosion and time loss, an aqueous solution of 10% or less by weight of sulfuric acid or an aqueous solution of 30% or less by weight of hydrochloric acid can be used preferably at ordinary temperature for about 2 to about 8 minutes.

After the blackening-treated film 5 exposed to the upper-layer holes 7 is removed as described above, an electrically conductive matter is filled in the holes 7 by a predetermined method to prepare electrically conductive portions 12 for electrically connecting the upper- and lower-layer electrically conductive circuits 4a and 4b. The electrically conductive portions 12 may be formed by soldering or may be formed by filling electrically conductive paste such as copper, silver or carbon in the holes 7 and thermally hardening the paste corresponding to the necessity. If necessary, the portion unnecessary for soldering or filling of the electrically conductive paste may be coated with a solder resist 9 by printing or other means and, on the other hand, the necessary portion is used for mounting an electronic element 10 or the like and then subjected to soldering 11.

Figure 5:
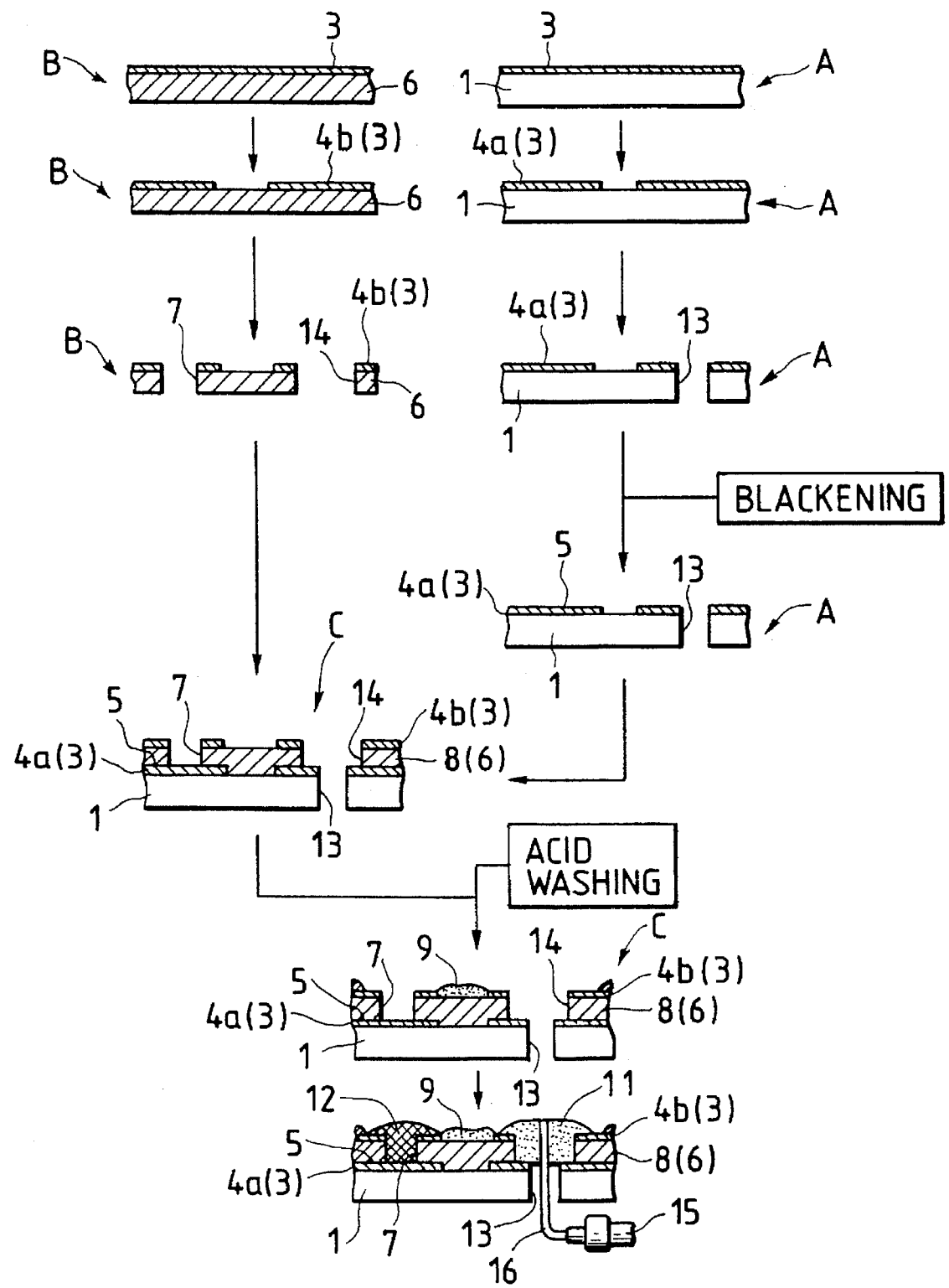

FIG. 5 shows another example as related to a multilayer printed-circuit substrate having stiffness as in FIG. 4 and the method of producing the same. The point in which FIG. 5 is different from FIG. 4 is as follows. A hard sheet-shaped reinforcement material 1 made of thermosetting resin such as phenol resin or epoxy resin and having a thickness of 0.3 to 3.2 mm is used as the laminate A. A metal layer 3 made of copper foil or the like and laminated thereon is etched in the same manner as described above to form a lower-layer electrically conductive circuit 4a. Then, feedthrough holes 13 are formed. Further, a blackening- treated film 5 is formed on the surface of the electrically conductive circuit 4a in the same manner as described above.

A laminate B having an upper-layer electrically conductive circuit 4b on the upper surface thereof, holes 7 and feedthrough holes 14 is prepared in the same manner as in FIG. 4. The laminate B is piled up on the laminate A so that the feedthrough holes 13 and 14 coincide with each other. Then, the laminates A and B are pressure-stuck to each other under application of heat and pressure. At the same time, the half-hardened resin of the laminate B is hardened to form an insulating resin layer 8 to thereby prepare a laminate C having the upper- and lower-layer electrically conductive circuits 4a and 4b.

The laminate C thus prepared is subjected to acid washing treatment in the same manner as in FIG. 4 to dissolve the blackening-treated film 5 exposed at the bottom of the holes 7 and in the feedthrough holes 14 and remove it. Then, coating with a solder resist and forming of electrically conductive portions 12 by use of the holes 7 are performed. Then, soldering 11 of a lead 16 connected to an electronic part 15 is performed.

Figure 6:
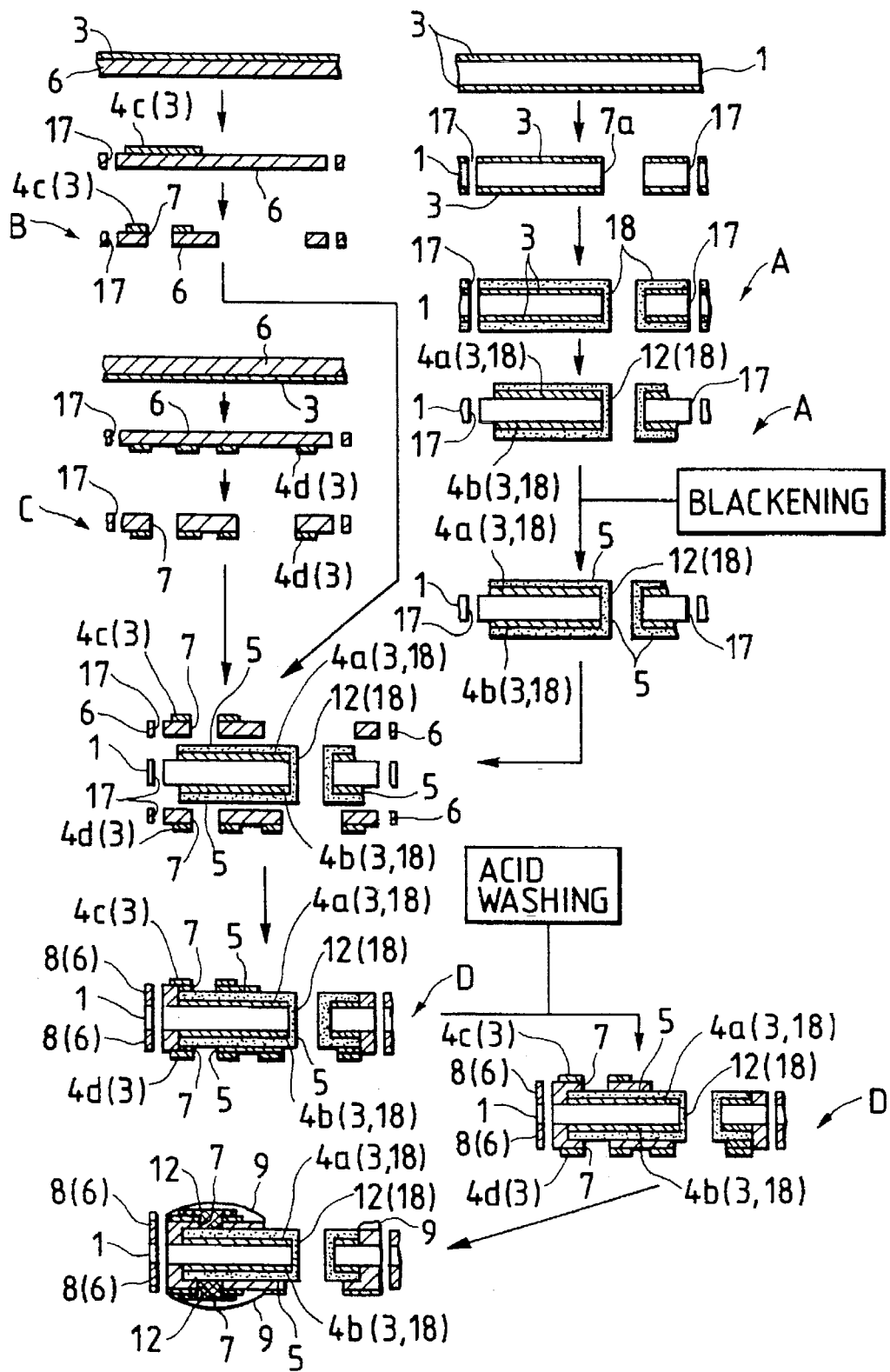

FIG. 6 shows a further example as related to a multilayer printed-circuit substrate having stiffness as in FIG. 4 and the method of producing the same. The point in which FIG. 6 is different from FIG. 4 is as follows. Metal layers 3 are laminated on the upper and lower surfaces of a hard sheet-shaped reinforcement material 1 formed of hard resin or the like. Feedthrough holes 17 for positioning and holes for forming electrically conductive portions are formed. Then, plating layers 18 are formed by through-hole plating according to an ordinary method such as an electroless plating method or an electrolytic plating method to thereby prepare a laminate A having the electrically conductive plating layers 18 on the double sides and in the holes 7a. In respect to the laminate A, etching treatment is applied to the double sides thereof by an ordinary method to form predetermined circuit patterns, so that predetermined electrically conductive circuits 4a and 4b having the metal layers 3 and the plating layers 18 are formed on the double surfaces thereof. The electrically conductive circuits are electrically connected to each other by portions of the plating layer 18, that is, electrically conductive portions 12 located in the holes 7a.

The laminate A thus prepared is subjected to blackening treatment in the same manner as described above to thereby form blackening-treated films on the electrically conductive circuits 4a and 4b and the whole surface of the electrically conductive portions 12 formed in the holes 7a.

Laminates B and C each having upper- and lower-layer electrically conductive circuits 4c and 4d on the upper surface thereof and having holes 7 and feedthrough holes 17 for positioning are prepared in the same manner as in FIG.

4. The laminates B and C are respectively piled up on the opposite sides of the laminate A so that the respective positioning feedthrough holes 17 coincide with each other. The laminates are pressure-stuck to each other under application of heat and pressure in the same condition as described above to harden the half-hardened resin of the laminates B and C to form insulating resin layers 8. Thus, a laminate D having the electrically conductive circuits 4a and 4c on the upper side of the hard sheet-shaped reinforcement material 1 and having the electrically conductive circuits 4b and 4d on the lower side thereof is prepared.

The laminate D thus prepared is subjected to acid washing treatment in the same manner as in FIG. 4 to dissolve the blackening-treated films 5 exposed at the bottom of the holes 7 and in the surface of the electrically conductive portions 12 and remove them, so that the electrically conductive portions 12 are formed for electrically connecting the upper-surface side electrically conductive circuit 4a and the upper-layer electrically conductive circuit 4c to each other through the holes 7 of the laminate B and that the other electrically conductive portions 12 are formed for electrically connecting the surface side electrically conductive circuit 4b and the lower-layer electrically conductive circuit 4d to each other through the holes 7 of the laminate C. Then, these electrically conductive portions 12 are coated with a solder resist 9 to protect the portions.

Figure 7:
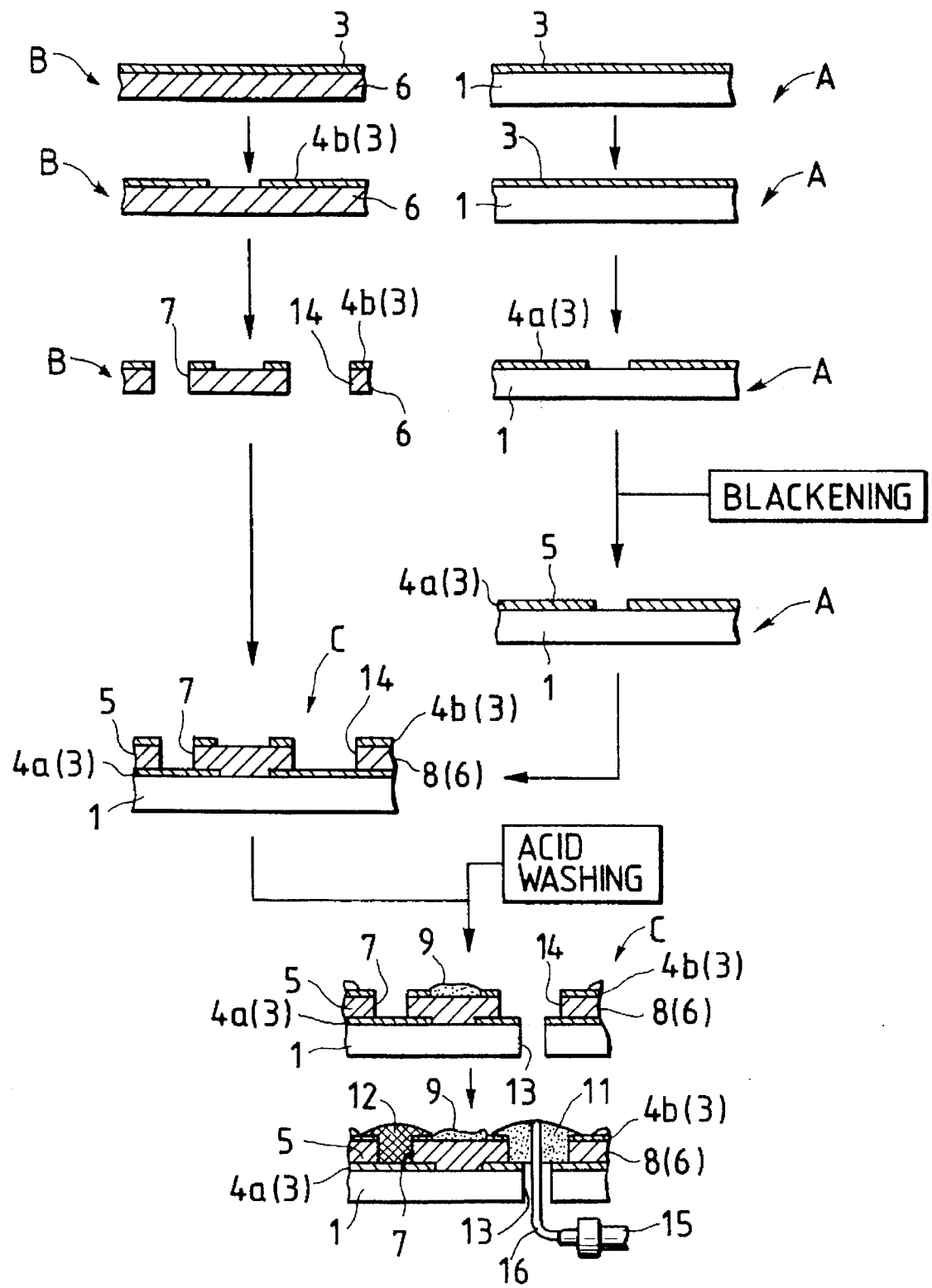
FIG. 7 is an explanatory sectional view showing an example of a process for producing a flexible multilayer printed-circuit substrate having flexibility according to the invention.

FIG. 7 shows an example in which a flexible multilayer printed-circuit substrate having a lowest-positioned insulating resin layer having flexibility is produced.

In short, a metal layer 3 is stuck to a half-hardened insulating resin sheet 6 obtained by impregnating a flexible sheet such as aromatic polyamide nonwoven fabric, glass fiber fabric or the like with a diallyl phthalate resin composition or the like to thereby prepare a laminate A. The thermosetting resin of the half-hardened insulating resin sheet 6 is hardened to form the laminate A having the metal layer 3 laminated to the insulating resin layer 1 having flexibility. Then, the metal layer 3 of the laminate A is etched to a predetermined circuit pattern to form a lower-layer electrically conductive circuit 4a. The etching step can carried out in the same manner as in FIG. 4.

The laminate A having the lower-layer electrically conductive circuit 4a laminated as described above is then subjected to blackening treatment in the same manner as in FIG. 4 to thereby prepare a blackening-treated film 5 on the whole surface of the electrically conductive circuit 4a.

On the other hand, a laminate B to be laminated on the upper surface of the laminate A is prepared in the same manner as in FIG. 4. Then, an upper-layer electrically conductive circuit 4b is formed by etching treatment in the same manner. Further, holes 7 used for electrically connecting the upper- and lower-layer electrically conductive circuits 4b and 4a to each other are formed.

The laminate B thus prepared is piled up on the laminate A, so that the laminates A and B are united in one body in the same manner as in FIG. 4 and, at the same time, the half-hardened resin of the half-hardened insulating resin sheet 6 of the laminate B is hardened to form an insulating resin layer 8 having flexibility. Thus, a laminate C having the upper- and lower-layer electrically conductive circuits 4a and 4b is formed. The condition for application of heat and pressure at the time of the pressure-sticking is different from that in FIG. 4. The conditions for preparation are the temperature of 120° to 160° C., the pressure of 30 to 70 kg/cm$^2$.G and the period of 10 to 60 minutes.

The laminate C is subjected to acid washing treatment in the same manner as in FIG. 4. Then, an electrically conductive matter is filled in the holes by a predetermined method to form electrically conductive portions 12 for electrically connecting the upper- and lower-layer electrically conductive circuits 4a and 4b. If necessary, the portion unnecessary for soldering may be coated with a solder resist 9 or protective film such as a cover layer by printing or other means. FIG. 7 is different from FIG. 4 in that in the case of FIG. 7, feedthrough holes 13 for mounting electronic parts are formed after the aforementioned steps, so that the necessary portion is used for mounting an electronic element 15 or the like and then subjected to soldering 11.

Figure 8A:
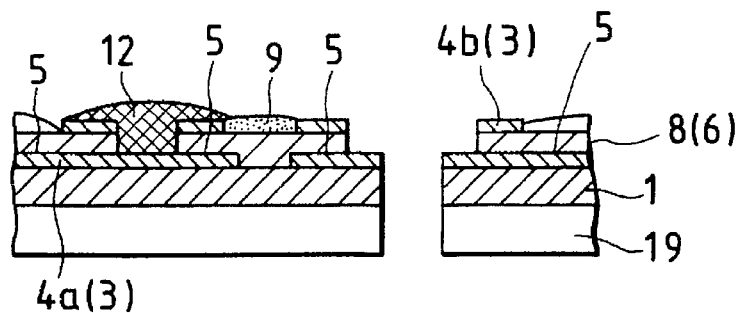
FIGS. 8(a) and 8(b) are explanatory sectional views showing the case where a flexible sheet-shaped reinforcement material is laminated on the flexible multilayer printed-circuit substrate.
Figure 8B:
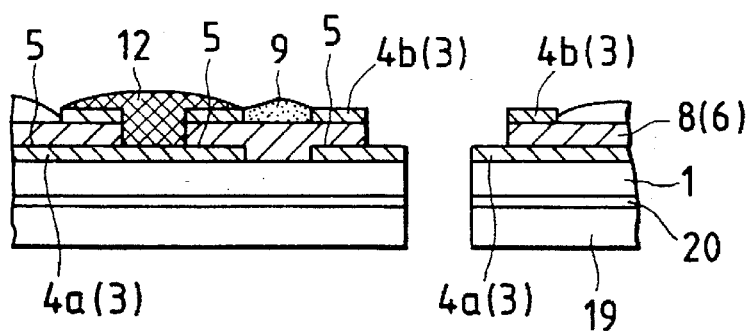

In respect to the flexible multilayer printed-circuit substrate as shown in FIGS. 8(a) and 8(b), a suitably flexible sheet-shaped reinforcement material 19 is laminated on the lower surface side of the lowermost insulating resin layer 1 for the double purpose of giving suitable stiffness and preventing cracking. In FIG. 8(a), when the laminate A having the metal layer 3 laminated on the insulating resin layer 1 having flexibility is prepared by hardening the half-hardened insulating resin of the half-hardened insulating resin sheet of the laminate A under application of heat and pressure, the flexible sheet-shaped reinforcement material 19 made of aromatic polyamide nonwoven fabric, glass fiber fabric or the like having a thickness of 0.2 mm or less may be piled on the lower surface side of the half-hardened insulating resin sheet 6 of the laminate A and laminated on the insulating resin layer 1 in one body, or a blackening-treated film 5 may be provided on the electrically conductive circuit 4a(3) of the laminate A having the half-hardened insulating resin sheet 6 and then the flexible sheet-shaped reinforcement material 19 may be piled on the lower surface side of the half-hardened insulating resin sheet 6 of the laminate A in the same manner and laminated to the insulating resin layer 1 in one body when the half-hardened insulating resin sheets 6 of the laminates A and B are hardened under application of heat and pressure. FIG. 8(b) shows the case where the insulating resin layer 1 of the laminate A has no adhesive property. In FIG. 8(b), the flexible sheet-shaped reinforcement material 19 is integrally laminated on the lower surface side of the lowermost insulating resin layer 1 through a suitable adhesive agent layer 20. Though not shown, a hard sheet-shaped reinforcement material of paper phenol, glass epoxy or the like may be stuck to the electronic parts mounting portion in the same manner as in the case of a commonly known hard flexible substrate.

Figure 9A:
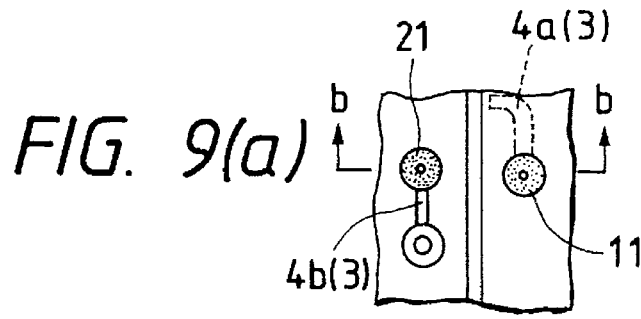
FIGS. 9(a) and 9(b) are explanatory plan and sectional views showing an example of a structure in which upper- and lower-positioned electrically conductive circuits adjacent to each other are connected to each other by a jumper wire.
Figure 9B:
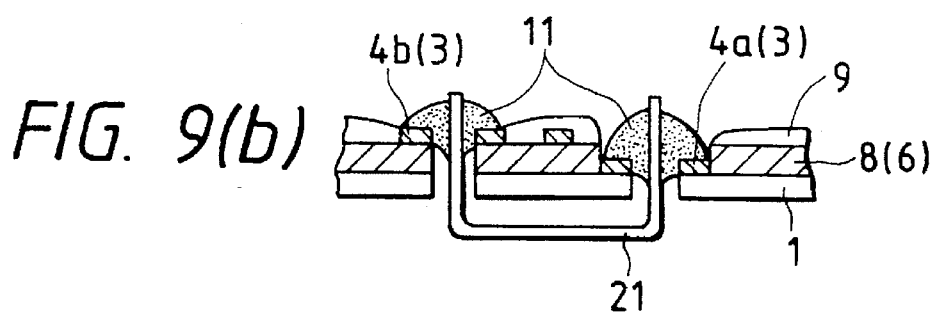

FIGS. 9(a) and 9(b) show a further method for electrically connecting adjacent upper- and lower-positioned electrically conductive circuits to each other, in which a jumper 21 formed of copper wire, tinned copper wire or the like is subjected to soldering 11.

According to the present invention, a multilayer structure can be attained with no use of adhesive agents. Accordingly, the substrate is excellent in performances such as heat-resisting property, durability against solvent, and the like. Further, no failure is caused in electric connection by the smear phenomenon or the like at the time of through-hole plating. Accordingly, the producing steps can be provided simply and easily. Furthermore, blackening-treated films formed by applying blackening treatment to electrically conductive circuits are disposed between the electrically conductive circuits and insulating resin layers covering thereon. Accordingly, the substrate is improved in adhesion between the layers so greatly that excellent reliability can be maintained against the repetition of heat stress caused by soldering or the like.

The present invention will be described more in detail with reference to the following examples 1–5 thereof and comparative examples.

EXAMPLE 1

Figure 10A:
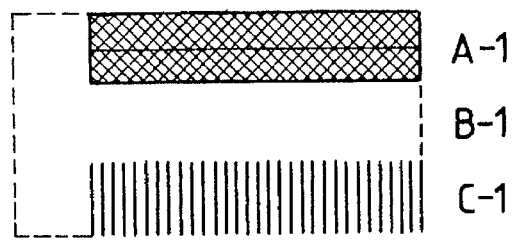
FIGS. 10(a), 10(b), 11(a) and 11(b) are explanatory views showing circuit patterns of the multilayer printed-circuit substrate produced in Examples of the invention.
Figure 10B:
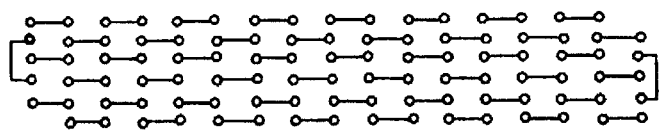

Copper foil having a thickness of 35 µm was stuck to a glass epoxy sheet having a thickness of 1.6 mm. The copper foil of the glass epoxy sheet was degreased by Freon. A first-layer circuit pattern as shown in FIGS. 10(a) and 10(b) was printed on the copper foil by a screen printing method using alkali-soluble acid-resistant ink (products number X-77 produced by TAIYO INK MFG. Co., Ltd.). After the copper foil was etched by ferric chloride, the resist was separated by a 2.4% by weight of sodium hydroxide solution. After the solution was neutralized by a 0.61% by weight of sulfuric acid solution, the copper foil was washed with water and dried under reduced pressure. Thus, seven laminated samples each having a lower-positioned conductive circuit having the circuit pattern as shown in FIGS. 10(a) and 10(b) were prepared.

Four samples of the seven laminated samples each having the conductive circuit having the circuit pattern were subjected to blackening treatment in the following manner to prepare blackening-treated films on the surfaces of the conductive circuits.

First, 150 ml of MB-438A and 450 ml of MB-438B as an available blackening treatment solution (tradename: EMPLATE MB-438, produced by JAPAN MELTEX Inc.) mainly containing sodium nitrite, sodium hydroxide and trisodium phosphate were mixed with 400 ml of pure water. The surfaces of the conductive circuits in the respective samples were polished by buffing. Then the samples were degreased under the condition of 80° C. and 5 minutes by use of a degreasing treatment agent prepared by dissolving 45 g of a degreasing agent (tradename: EMPLATE PC-499, produced by JAPAN MELTEX Inc.) in 1 l of water. Then, the samples were washed with water and subjected to soft etching under the conditions of 30° to 40° C. and 3 minutes by use of a treatment agent prepared by dissolving 150 g of a plating pretreatment agent (tradename: AD485, produced by JAPAN MELTEX Inc.) and 10 ml of a 98% by weight of sulfuric acid in 1 l of water. Then, the samples were activated by a 10% by volume of sulfuric acid, immersed in the aforementioned blackening treatment solution under the conditions of 80° C. and 5 minutes, washed with water and dried to perform blackening treatment.

Figure 11A:
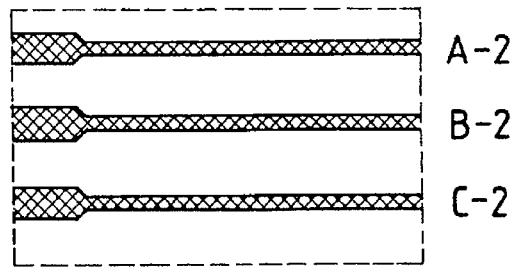
Figure 11B:
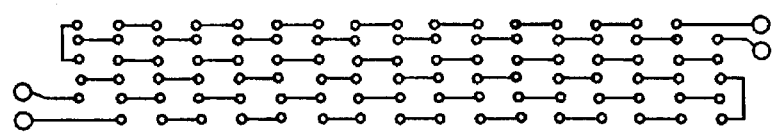

On the other hand, seven laminated samples each having a second-layer conductive circuit having a circuit pattern as shown in FIGS. 11(a) and 11(b) were prepared by applying the aforementioned etching treatment to a laminate (tradename: AMIFLEX, products number P-96B, produced by DAISO Inc.) prepared by laminating 35 µm-thick copper foil on a 65 µm-thick half-hardened insulating resin sheet made of aromatic polyamide fiber nonwoven fabric impregnated with a diallyl phthalate resin composition.

Then, the laminated samples were piled up on the laminated samples having the first-layer conductive circuits (inclusive of not yet blackened conductive circuits) and pressure-stuck to each other under the conditions of 160° C., 30 kg/cm².G and 30 minutes to harden the half-hardened resin and, at the same time, unite the samples in one body, respectively. Thus, laminated samples containing the first- and second-layer conductive circuits were prepared. Then the laminated samples were treated with a 10% by volume of sulfuric acid for 3 to 4 minutes. Copper paste (tradename: E-1000, produced by MITSUI MINING & SMELTING Co., Ltd.) was filled, by a screen printing method, in a through valley passing through the second-layer conductive circuit and an insulating resin layer formed by hardening the half-hardened resin and reaching to the first-layer conductive circuit. The paste was hardened under the conditions of 160° C. and 30 minutes to prepare conductive portions to thereby electrically connect the first- and second-layer conductive circuits to each other. Thus, multilayer printed-circuit substrates having stiffness were prepared.

The multilayer printed-circuit substrates having the circuit patterns as shown in FIGS. 10(a) and 10(b), that is, A: the pattern of copper foil on the copper foil, B: the pattern of copper foil on the material, and C: the pattern of copper foil on the 0.5 m-pitch pattern, were subjected to a peel test. The multilayer printed-circuit substrates having the circuit patterns as shown in FIGS. 11(b) and 10(b) were subjected to a solder heat-resistance test. Thus, the comparison in performance between the blackened substrates and the not-yet-blackened substrates was made.

The results were shown in Tables 1, 2 and 3.

The peel test shown in Table 1 was used for the purpose of comparison based on measurement of the minimum value of pull strength required for peeling the respective second-layer conductive circuit by 25 mm or more at a speed of 50 mm/min in a pulling direction perpendicular to a plane of the conductive circuit while clamping the top end thereof after peeling one end thereof into a suitable length.

The solder heat-resistance test shown in Table 2 was used for the double purposes of: observing the respective printed-circuit substrate with eyes as to whether swelling or peeling occurred or not (o: no abnormality, x: swelling and/or peeling) when floating the printed-circuit substrate in five cycles for every 10 seconds to immerse the whole surface of the printed- circuit substrate in a solder melting tank at 260° C.; and calculating resistance change rate from the initial value of electric resistance of the respective printed-circuit substrate and the value of electric resistance thereof measured in every cycle. In the test, the initial value was measured collectively of 50 holes.

Further, the solder heat-resistance test shown in Table 3 was used for the double purposes of: observing the respective printed-circuit substrate with eyes as to whether swelling or peeling occurred or not (o: no abnormality, x: swelling and/or peeling) when repeating by five times a cycle of of the steps of floating the printed-circuit substrate for 3 seconds to immerse the whole surface of the printed-circuit substrate in a solder melting tank at 260° C. and moving the printed-circuit substrate into an acetone tank in 15 seconds; and calculating resistance change rate from the initial value of electric resistance of the respective printed-circuit substrate and the value of electric resistance thereof measured in every cycle. In the test, the initial value was measured collectively of 50 holes.

TABLE 1

| | | On Cu-foil | On Substrate | On Pattern |
|---|---|---|---|---|
| 1st layer *1) | | A-1 | B-1 | C-1 |
| 2nd layer *2) | | A-2 | B-2 | C-2 |
| Blackened | Yes | 1.4 | 2.1 | 1.3 |
| | No | 0.2 | 1.8 | 0.96 |

(Unit: Kg/cm)

Note:
*1): Refer to FIG. 10(a);
*2): Refer to FIG. 11(a)

TABLE 2

| | Blackened | | Not-blackened | |
|---|---|---|---|---|
| | Resistance | Appearance | Resistance | Appearance |
| Initial Value (Ω) | 0.913–1.176 | o | 0.639–0.91 | o |
| Change of  1 | 1.74—17.54 | o | 17.6–33.8 | x |
| rate of re-  2 | 2.53—16.98 | o | 12.0–46 | x |
| sistance (%)  3 | 1.93—21.31 | o | 8.0–34.6 | x |
| 4 | 3.72—20.21 | o | 5–39.3 | x |
| 5 | 16.22—20.8 | Δ | 2.7–36.79 | x |

TABLE 3

| | Blackened | | Not-blackened | |
|---|---|---|---|---|
| | Resistance | Appearance | Resistance | Appearance |
| Initial Value (Ω) | 0.709–1.172 | o | 0.701–0.761 | o |
| Change of  1 | 2.82—20.46 | o | 25.2–38.2 | x |
| rate of re-  2 | 4.63—22.03 | o | 60.55–92.2 | x |
| sistance (%)  3 | 6.59—31.17 | o | 85.9–151 | x |
| 4 | 9.03—20.93 | o | 120.8–202.5 | x |
| 5 | 11.22—19.82 | Δ | 208.12–280.1 | x |

EXAMPLE 2

Ten first-layer laminated samples were prepared by using a 0.2 mm-thick glass epoxy sheet provided with 35 μm-thick copper foil stuck thereto. Blackening treatment films were formed on five samples thereof. Flexible multilayer printed-circuit substrates having flexibility were prepared by using a laminate (tradename: AMIFLEX, products number P-136B, produced by DAISO Inc.) as the second laminated sample. The flexible multilayer printed-circuit substrates were subjected to a peel test and a cycle test under the condition of 260° C., 10 seconds and 5 cycles in the same manner as in Example 1, for the purpose of comparison in performance between the blackened substrates and the not-yet- blackened substrates. The results were shown in Tables 4 and 5.

EXAMPLE 3

Flexible multilayer printed-circuit substrates were prepared in the same manner as in Example 2, except that the glass epoxy sheet used in Example 2 was replaced by aromatic polyamide nonwoven fabric impregnated with a diallyl phthalate resin composition and that the laminate used in Example 2 was replaced by a laminate (tradename: AMIFLEX, products number P-136A, produced by DAISO Inc.) formed by laminating 35 μm-thick copper foil on a 65 μm-thick half-hardened insulating resin sheet. The flexible multilayer printed-circuit substrates thus prepared were subjected to a peel test and a cycle test under the condition of 260° C., 10 seconds and 5 cycles in the same manner as in Example 1, for the purpose of comparison in performance between the blackened substrates and the not-yet-blackened substrates. The results were shown in Tables 4 and 5.

EXAMPLE 4

Flexible multilayer printed-circuit substrates were prepared by using the same material and in the same manner as in Example 3, except that 80 μm-thick aromatic polyamide nonwoven fabric (tradename: NOMEX ARAMID PAPER 410, produced by Du Pont de Nemours & Co.) was used as a flexible sheet-shaped reinforcement material and that the nonwoven fabric was pressure-stuck by use of a polyester-denaturated epoxy adhesive agent (products number T-5310, produced by NITTO ELECTRIC INDUSTRIAL Co., Ltd.) simultaneously at the time of lamination. The flexible multilayer printed-circuit substrates thus prepared were dried at 100° C. for one hour and then subjected to a peel test and a cycle test under the conditions of 260° C., 10 seconds and 5 cycles in the same manner as in Example 1, for the purpose of comparison in performance between the blackened substrates and the not-yet-blackened substrates. The results were shown in Tables 4 and 5.

EXAMPLE 5

Flexible multilayer printed-circuit substrates were prepared in the same manner as in Example 2, except that a flexible copper-stuck laminate (thickness: 125 μm, tradename: COSMOFLEX AH1120, produced by TOYOBO Co., Ltd.) formed by sticking 35 μm-thick copper foil to Aramid nonwoven fabric impregnated with unsaturated polyester was used as the first layer. The flexible multilayer printed-circuit substrates thus prepared were subjected to a peel test and a cycle test under the conditions of 260° C., 10 seconds and 5 cycles in the same manner as in Example 1, for the purpose of comparison in performance between the blackened substrates and the not-yet-blackened substrates. The results were shown in Tables 4 and 5.

TABLE 4

(Unit: Kg/cm)

| Example No. | 1st layer *1) 2nd layer *2) | | On Cu-foil A-1 A-2 | On Substrate B-1 B-2 | On Pattern C-1 C-2 |
|---|---|---|---|---|---|
| 2 | Blackened | Yes | 1.4 | 2.1 | 1.3 |
|   |           | No  | 0.2 | 1.8 | 1.0 |
| 3 | Blackened | Yes | 1.1 | 1.2 | 1.0 |
|   |           | No  | 0.2 | 1.2 | 1.0 |
| 4 | Blackened | Yes | 1.1 | 1.2 | 1.0 |
|   |           | No  | 0.2 | 1.2 | 1.0 |
| 5 | Blackened | Yes | 1.5 | 1.2 | 1.2 |
|   |           | No  | 0.2 | 1.2 | 1.0 |

Note:
*1): Refer to FIG. 10(a);
*2): Refer to FIG. 11(a)

TABLE 5

| Example No. | Blackened (Yes/No) | Initial Value (Ω) | Resistance change rate after test (%) | Heat resistance at 260° C. (sec) |
|---|---|---|---|---|
| 2 | Yes | 0.71–1.17 | −20–+16 | ≧40 |
|   | No  | 0.70–0.76 | +3– disconnection | ≦10 |
| 3 | Yes | 0.67–0.83 | −20–+11 | ≧50 |
|   | No  | 0.67–0.80 | +8– disconnection | ≦10 |
| 4 | Yes | 0.67–0.80 | −20–+11 | ≧50 |
|   | No  | 0.67–0.80 | +8– disconnection | ≦10 |
| 5 | Yes | 0.62–0.79 | −12–+11 | ≧50 |
|   | No  | 0.62–0.73 | +7– disconnection | ≦10 |

According to the present invention, a multilayer printed-circuit substrate excellent in adhesion between the conductive circuit and the insulating resin layer for covering the conductive circuit, free from swelling and peeling against repetition of heat stress on the solder portion or the like, excellent in reliability on repetition of the exchange of parts and simple and easy to produce can be provided. Further, a method for producing the aforementioned multilayer printed-circuit substrate can be provided.

A wiring substrate according to the present invention will then be described in detail.

A sheet-like insulating base material used in the present invention has the property that it absorbs water and is softened with the sacked water as a plasticizer when soaked in water. When softened, the sheet-like insulating base material exhibits the property of plasticity suitable for plastic work such as bending, drawing, and the like. After the base material is subjected to the plastic work and dried, it is hardened again so as to have the property that a predetermined shape is maintained. Typical examples of the sheet-like insulating base material include natural cellulose sheets such as vulcanized fiber and press board, crystalline polymer sheets such as aromatic polyamide nonwoven fabric called "aramid paper", and the like.

In the case where the wiring substrate has a monolayer electrically conductive circuit, the material for the insulating resin layer laminated on the surface of the insulating base material can be selected from thermoplastic resin and thermosetting resin as long as the electrically conductive circuit can be stuck to the insulating base material and the material can satisfy the heat-resistance temperature required based on the heating temperature at the time of plastic work and required by electronic appliances. Examples of the material for the insulating resin layer may include epoxy resin, diallyl phthalate resin, polyimide resin, polyamide-imide resin, melamine resin, urea resin, and the like. From the point of view of protecting the electrically conductive circuit from expanding or breaking at the time of plastic work, the preferred insulating layer is prepared by the steps of: impregnating a flexible sheet, such as aramid paper, glass nonwoven fabric, or the like, with thermosetting resin, more preferably, diallyl phthalate resin exhibiting a stable half-hardened state, such as diallyl terephthalate, diallyl isophthalate, diallyl orthophthalate, or the like, to prepare a material; and hardening the thermoplastic resin at the time of pressure-sticking under application of heat and pressure after putting the material between the insulating base material and the electrically conductive metal layer.

In the case where the wiring substrate is a multilayer wiring substrate having a plurality of electrically conductive circuits, it is necessary to insulate the electrically conductive circuits of the respective layers perfectly from each other and to protect the electrically conductive circuits from expanding or breaking at the time of plastic work. Therefore, the respective preferred insulating layer is prepared through a process including the steps of: impregnating a flexible sheet, such as aramid paper, glass nonwoven fabric, or the like, with thermosetting resin, more preferably, diallyl phthalate resin exhibiting a stable half-hardened state, such as diallyl terephthalate, diallyl isophthalate, diallyl orthophthalate, or the like, to prepare a material; and hardening the thermoplastic resin at the time of pressure-sticking under application of heat and pressure after putting the material between the insulating base material and the electrically conductive metal layer.

In respect to the electrically conductive circuit prepared by etching to a predetermined circuit pattern, metals generally used in this type wiring substrate, such as for example copper, nickel, aluminum, and the like, may be used.

In the case where the wiring substrate is a multilayer wiring substrate, current conduction portions are formed at predetermined positions between the respective electrically conductive circuits. The material for the current conduction portions is not limited specifically, as long as adjacent electrically conductive circuits can be connected to each other by the current conduction portions. To secure the electrical connection, the preferred current conduction portions have a structure formed by the steps of: providing holes passing through upper-positioned electrically conductive circuits and insulating resin layers provided in the lower surface side thereof; and filling the holes with an electrically conductive matter, such as electrically conductive paste of copper, silver, carbon or the like, solder, and the like, to thereby electrically connect the upper- and lower-positioned electrically conductive circuits to each other.

The wiring substrate or multilayer wiring substrate according to the present invention may be provided as a produce in a flat sheet state before a desired form is attained by plastic work such as bending, drawing, or the like. Alternatively, the wiring substrate may be provided as a produce with a curve portion formed by plastic work such as bending, drawing, or the like, so as to have a shape required by the substrate packing space in electronic appliances.

In the following, processes for producing the aforementioned wiring substrate and multilayer wiring substrate according to the present invention will be described.

The process for producing a wiring substrate having a monolayer electrically conductive circuit basically comprises the steps of: providing an insulating resin layer on a surface of a sheet-like insulating base material made of hydrophilic high molecules capable of being plasticized when the hydrophilic high molecules absorb water and capable of being hardened when the hydrophilic high molecules are dried and at the same time providing an electrically conductive metal layer on the insulating resin layer to thereby prepare a laminate; pressure-sticking the laminate under application of heat and pressure to form one united body; etching the electrically conductive metal layer to have a predetermined circuit pattern to thereby form an electrically conductive circuit; making the insulating base material absorb water so as to be plasticized and at the same time applying plastic work to the insulating base material to give a predetermined shape thereto; and then drying the insulating base material.

The process for producing a multilayer wiring substrate having a plurality of electrically conductive circuits laminated basically comprises the steps of: laminating electrically conductive metal layers to half-hardened insulating resin layers exhibiting stable half-hardened states respectively to prepare laminated matters, and then etching the electrically conductive metal layers of the laminated matters to form predetermined circuit patterns to thereby prepare a plurality of laminates each having the half-hardened insulating resin layer and the electrically conductive circuit; successively laminating the laminates on a surface of a sheet-like insulating base material with the electrically conductive circuits of the respective laminates upward, pressure-sticking the stack of the laminates under application of heat and pressure and at the same time hardening the half-hardened insulating resin layers of the primary laminates to thereby prepare a multilayer laminate; forming current conduction portions each for electrically connecting upper- and lower-positioned electrically conductive circuits to each other in the course of preparing the multilayer laminate; and making the insulating base material absorb water so as to be plasticized and at the same time applying plastic work to the insulating base material to give a predetermined shape thereto.

In the following, the processes of producing the wiring substrate and the multilayer wiring substrate will be described more specifically with reference to FIGS. 12–17.

FIGS. 12(a) through 12(e) show an example of the configuration of a wiring substrate having a monolayer electrically conductive circuit. An insulating resin layer 52 is provided on a surface of a sheet-like insulating base material 51 and at the same time an electrically conductive metal layer 53 is provided through the insulating resin layer 52, to prepare a laminate. The laminate is pressure-stuck under application of heat and pressure to form one body (Refer to FIGS. 12(a) and 12(b)). Although the conditions for application of heat and pressure at the time of the pressure-sticking vary according to the kind, thickness, combination and the like of resin used in the insulating base material 1 and insulating resin layer 52, it is preferable to attain so-called anchor effect that resin used is partly impregnated in the surface of the insulating base material 51 to form a resin-impregnated layer A as shown enlargedly in FIG. 13. The heating condition is not limited if the temperature is within the range of the heat-resisting temperature of the insulating base material 1 and can harden the resin used in the insulating resin layer 52. The pressure condition is not limited if the insulating base material 51 and the insulating resin layer 52 can be stuck closely to each other to keep a state in which no bubble remains. When, for example, thermosetting resin is used in the insulating resin layer 52, the preferred condition is the temperature of 120° to 170° C., the pressure of 5 to 70 kg/cm$^2$.G and the period of 30 to 60 minutes. The insulating resin layer 52 may be laminated on the insulating base material 51 before the electrically conductive metal layer 53 is laminated on the insulating resin layer 52. Alternatively, the insulating resin layer 52 may be laminated on the electrically conductive metal layer 53 before the insulating resin layer 52 is laminated on the insulating base material 51. In the case where thermosetting resin is used as resin constituting the insulating resin layer 52, the resin is hardened at the time of the pressure-sticking under application of heat and pressure.

Figure 12A:
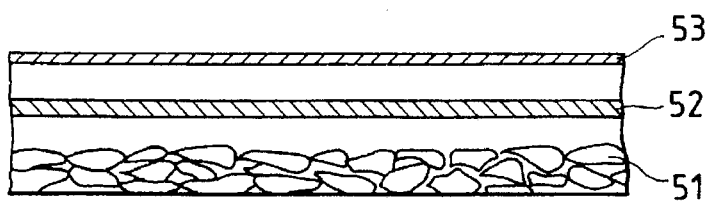
FIGS. 12(a) through 12(e) are explanatory sectional views showing a process for producing a wiring substrate according to the present invention.
Figure 12B:
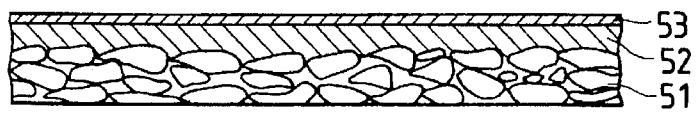
Figure 12C:
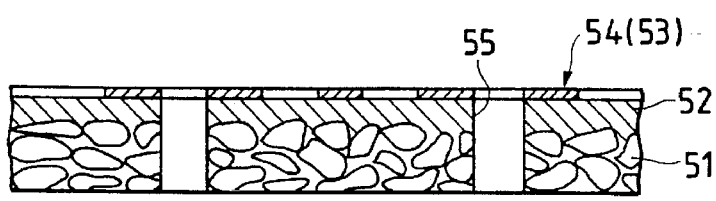

In the laminate thus prepared, the electrically conductive metal layer 52 is etched to form a predetermined circuit pattern to thereby form an electrically conductive circuit 54 and then feedthrough holes 55 necessary for mounting electronic parts are formed by perforating work (Refer to FIG. 12(c)). The etching treatment can be carried out by any conventionally known method. For example, the etching treatment can be carried out by the steps of: degreasing the electrically conductive metal layer 53; forming a circuit pattern with an etching resist of alkali-soluble acid-resistant ink by screen printing; etching the electrically conductive metal layer by ferric chloride solution after drying; separating the resist by using alkali solution such as sodium hydroxide solution or the like; neutralizing the solution with acid solution such as sulfuric acid solution or the like; and then washing and drying it at an ordinary temperature.

Figure 12D:
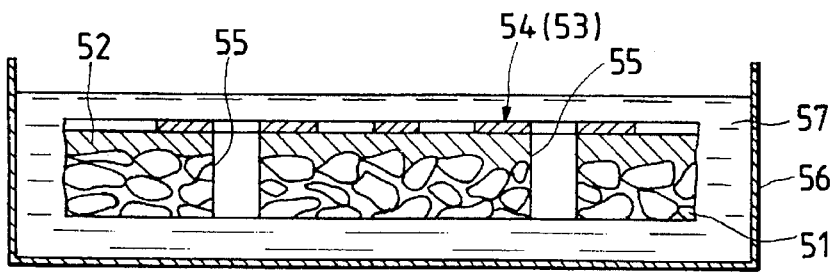

In the laminate formed in such a manner as described above and having the electrically conductive circuit 54 laminated, water is added to the insulating base material 1 thereof to plasticize the latter. A method of spraying water, a method of exposing the insulating base material under high humidity for a predetermined time, or the like may be used as the water adding method. The preferred method is a method of soaking the insulating base material for a predetermined time in water 57 filled in a tank 6 as shown in FIG. 12(d). The soaking conditions vary according to the material, thickness, and the like, of the insulating base material 51. When, for example, the insulating base material is made of natural cellulose vulcanized fiber, it is preferably soaked for a period of 10 to 40 minutes at an ordinary temperature. When, for example, the insulating base material is made of aromatic polyamide aramid paper, it is preferably soaked for a period of 6 to 24 hours at an ordinary temperature. In such conditions, the water content of the insulating base material 51 is generally about 15 to about 35% by weight, preferably, about 20 to 30% by weight. When the water content as described above is attained, expansion of the material at the time of the breaking thereof is increased by about twice so that the material is changed to a strong and soft material.

Figure 12E:
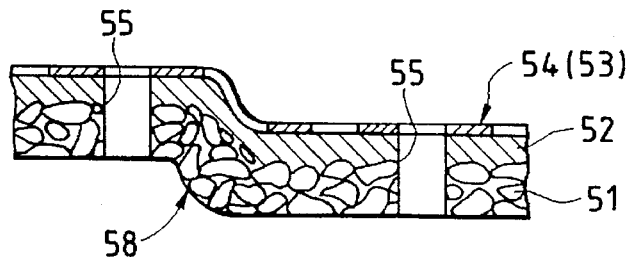
Figure 13:
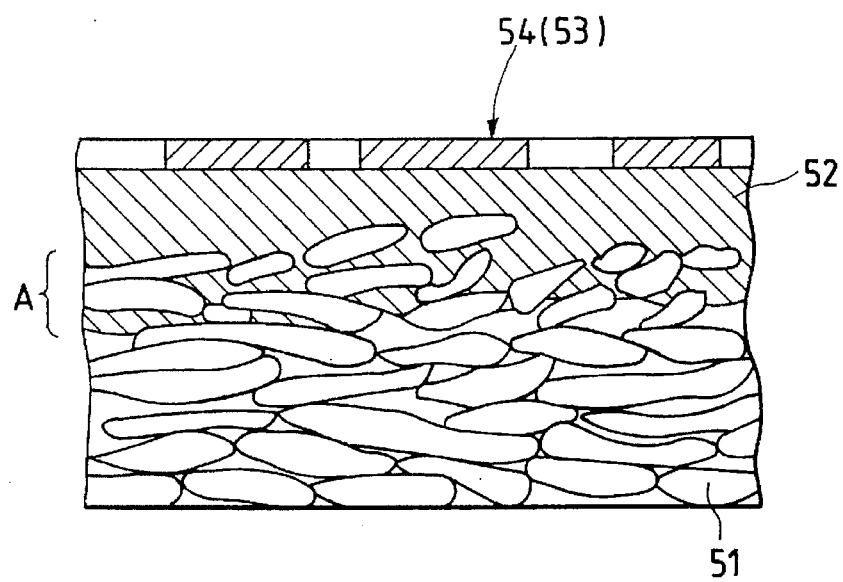
FIG. 13 is an explanatory partly enlarged sectional view of the wiring substrate produced by the process as shown in FIGS. 12(a) through 12(e)

After plasticized as described above, the insulating base material 51 is re-formed to a predetermined form by plastic work such as bending, drawing, or the like, and then dried to thereby prepare a final product having a curve portion 58 at a predetermined position (Refer to FIG. 12(e)). The conditions in the plastic work may be selected suitably in accordance with the material and thickness of the insulating base material and the kind, thickness, and the like, of the resin constituting the insulating resin layer 52. For example, the heating temperature can be selected in the range of from an ordinary temperature to 150° C. in a state in which the bending form is maintained. Preferably, a temperature not less than the boiling point of water can be selected. The preferred heating time is a time required for volatilizing water at a temperature of 100° to 130° C. For example, the time is about 2 to about 3 hours. If the resin is hardened by both heating and drying in the plastic work, the returning of the curve portion 58 can be prevented as sufficiently as possible.

Figure 14:
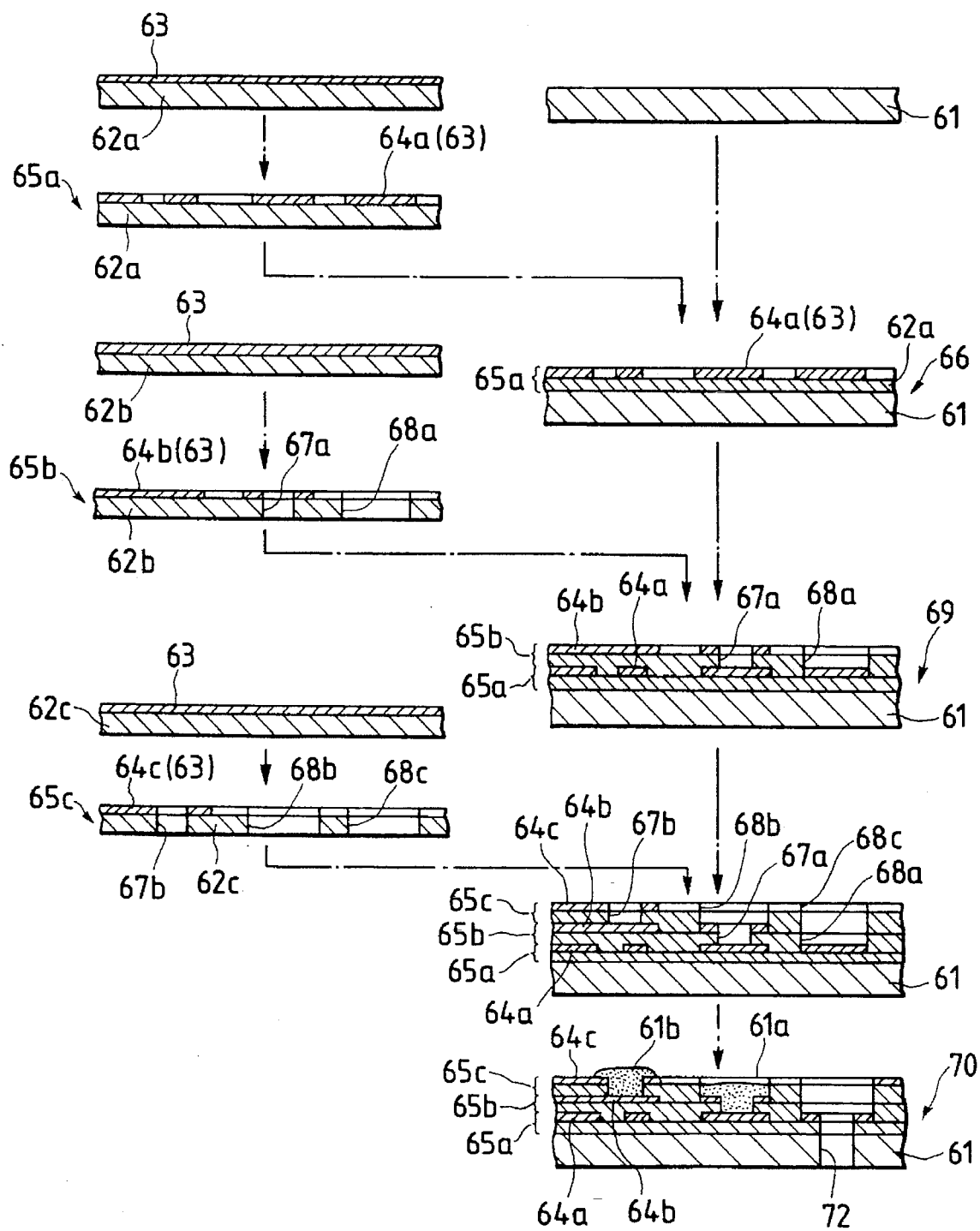
FIG. 14 is an explanatory sectional view showing a process for producing a multilayer wiring substrate according to the invention.

FIG. 14 shows a first example in the case where the wiring substrate is a multilayer wiring substrate having a plurality of electrically conductive circuits.

First, a laminate 65a having an electrically conductive circuit 64a is prepared through the steps of: laminating an electrically conductive metal layer 63 onto a half-hardened insulating resin layer 62a prepared by impregnating a flexible sheet such as aramid paper or the like with half-hardened resin exhibiting a stable half-hardened state such as diallyl phthalate resin or the like; and etching the electrically conductive metal layer 63 of the resulting laminate to a predetermined circuit pattern. The etching treatment may be carried out by an ordinary method in the same manner as described above.

Then, a laminate 66 having the first electrically conductive circuit 64a in the upper surface thereof is formed through the steps of: laminating the laminate 65a prepared as described above onto a surface of a sheet-like insulating base material 61 such as vulcanized fiber or the like while turning the electrically conductive circuit 64a thereof upward; and pressure-sticking the resulting laminate under application of heat and pressure to harden the half-hardened insulating resin layer 62a of the laminate 65a. The conditions for the pressure-sticking under application of heat and pressure are the same as described above.

On the other hand, a laminate 65b having, in a surface thereof, a second electrically conductive circuit 64b having the same circuit pattern as that of the electrically conductive circuit 64a or a circuit pattern different from that of the electrically conductive circuit 64a is prepared in the same manner as described above. Holes 67a used for electrical connection to the electrically conductive circuit 64a of the laminate 65a and holes 18a necessary for mounting electronic parts are formed in the laminate 65b. Then, the laminate 65b is laminated on the upper surface of the laminate 66, so that a laminate 69 having the electrically conductive circuit 64b in the upper surface thereof is formed in the same manner as the laminate 66.

In the method shown in FIG. 14, a laminate 65c having a third electrically conductive circuit 64c in a surface thereof and having holes 67b, 68b and 68c is further formed. The laminate 65c is laminated on the laminate 69, so that a final laminate 70 having the electrically conductive circuit 64c in the upper surface thereof is formed in the same manner as described above. Then, the holes 67a of the laminate 65b having the electrically conductive circuit 64b and the holes 67b of the laminate 65c having the electrically conductive matter 64c are respectively filled with an electrically conductive matter. If necessary, the electrically conductive matter is hardened by heating to form electric connection portions 71a and 71b for electrically connecting between the electrically conductive circuits 64a, 64b and 64c. At the same time, feedthrough holes 72 piercing the secondary laminate 66 through the holes 68a and 68c respectively are formed for the purpose of mounting electronic parts.

The half-hardened insulating resin layers 62a, 62b and 62c of the laminates 65a, 65b and 65c are hardened in the pressure-sticking step under application of heat and pressure to thereby be changed into insulating resin layers (identified by the same numerals 62a, 62b and 62c in FIG. 15), respectively. In the pressure-sticking step, the half-hardened insulating resin layers 62b and 62c of the laminates 65b and 65c located in the relatively upper positions are partly melted to enter into electrically- non-conductive portions of the electrically conductive circuits of the laminates 65a and 65b located in the relatively lower positions and then hardened to thereby protect the electrically conductive circuits 64a and 64b.

The step of forming the current conduction portions 71a and 71b in the course of from the laminate 69 to the final laminate 70 is not limited to the procedure shown in FIG. 14. For example, the current conduction portion 71a for electrically connecting the electrically conductive circuits 64a and 64b may be formed just after the laminate 69 is produced. After the laminate 65c is then laminated thereon to form the final laminate 70, the current conduction portion 71b for electrically connecting the electrically conductive circuits 64b and 64c formed in the final laminate 70 may be formed. Although FIG. 14 shows the case where a multilayer wiring substrate having three-layer electrically conductive circuits is produced, it is a matter of course that the number of electrically conductive circuits to be laminated in the multilayer wiring substrate can be increased suitably by repeating the step of forming the current conduction portion.

Figure 15:
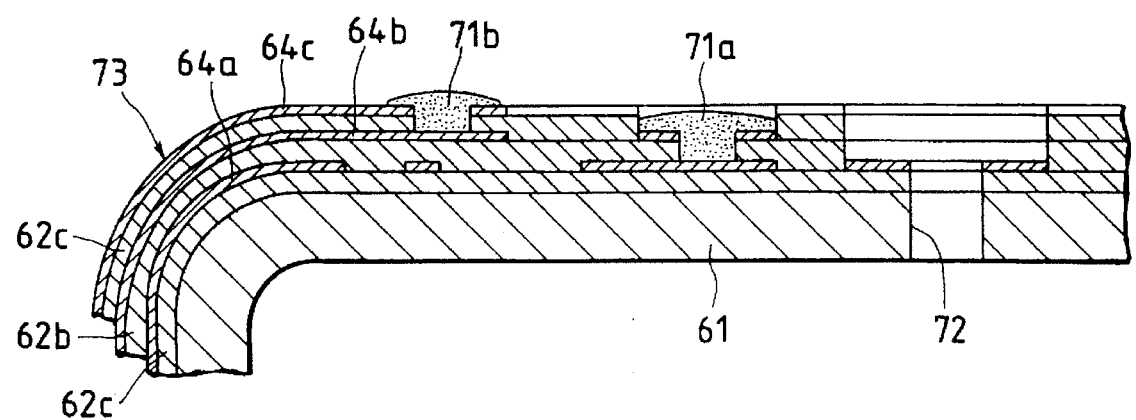
FIG. 15 is an explanatory partly enlarged sectional view of the wiring substrate produced by the process as shown in FIG. 14.

The final laminate 70 thus prepared is re-formed to a multilayer wiring substrate as a final product by the steps of: adding water to the insulating base material 61 in the same manner as described above to plasticize it; and subjecting it to plastic work such as bending, drawing, or the like, in the same manner as described above to form a predetermined curve portion 73 as shown in FIG. 15.

Figure 16:
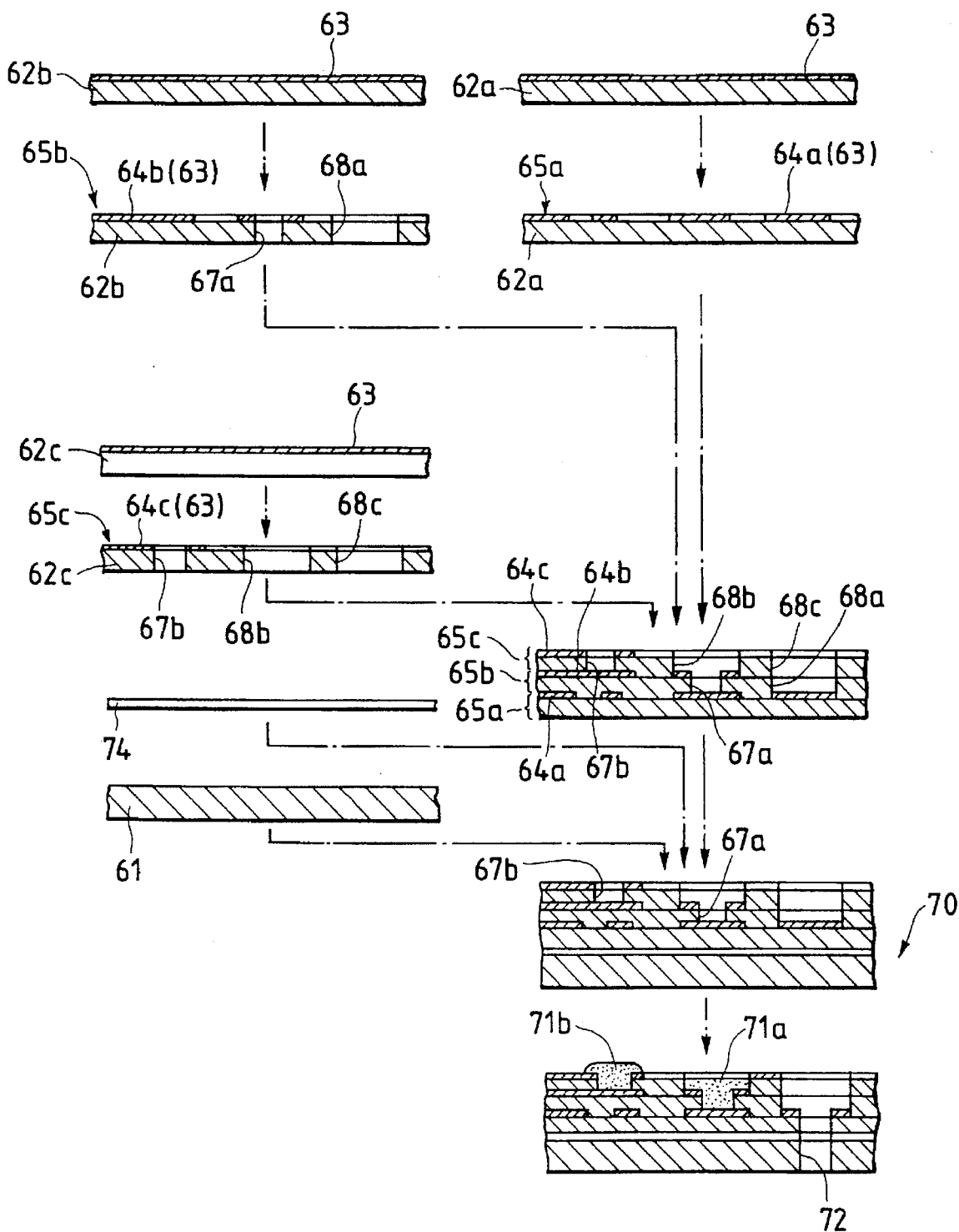
FIG. 16 is an explanatory sectional view showing another process for producing a multilayer wiring substrate according to the invention.

FIG. 16 shows another example in the case where the wiring substrate is a multilayer wiring substrate.

The process shown in FIG. 16 comprises the steps of: laminating electrically conductive metal layers 63 onto half-hardened insulating resin layers 62a, 62b and 62c exhibiting a stable half-hardened state, etching the electrically conductive metal layers 63 of the resulting laminates to prepare laminates 65a, 65b and 65c having electrically conductive circuits 64a, 64b and 64c, and forming holes 67a, 67b, 68a, 68b and 68c at predetermined positions in the laminates 65b and 65c for the purpose of use for electrically connecting between upper- and lower-positioned electrically conductive circuits or for the purpose of mounting electronic parts, respectively; successively laminating the laminates 65a, 65b and 65c with the electrically conductive circuits 64a, 64b and 64c thereof facing upward and then pressure-sticking the laminates under application of heat and pressure to harden the half-hardened insulating resin layers 62a, 62b and 62c of the laminates 65a, 65b and 65c to thereby unite the laminates 65a, 65b and 65c in one body; sticking a sheet-like insulating base material 61 to the lower surface side of the united laminates 65a, 65b and 65c through an adhesive agent layer 74 to form a final laminate 70; filling the holes 67a and 67b of the final laminate 70 with an electrically conductive matter to form current conduction portions 71a and 71b for electrically connecting between upper-positioned electrically conductive circuits 64b and 64c and lower-positioned electrically conductive circuits 64a and 64b; forming feedthrough holes 72 for mounting electronic parts through the holes 68a and 68c respectively; and adding water to the insulating base material 61 of the final laminate 70 to plasticize it and subjecting it to plastic work such as bending, drawing, or the like, in the same manner as described above.

Figure 17A:
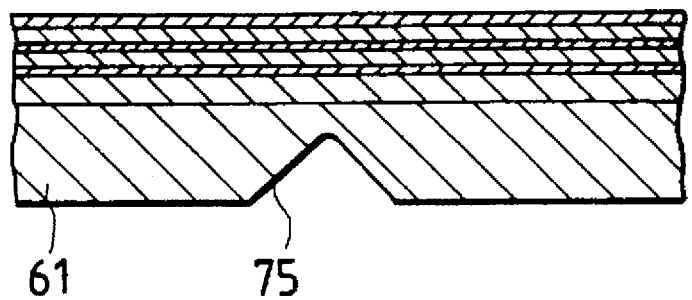
FIGS. 17(a) and 17(b) are explanatory sectional views showing an example of bending work.
Figure 17B:
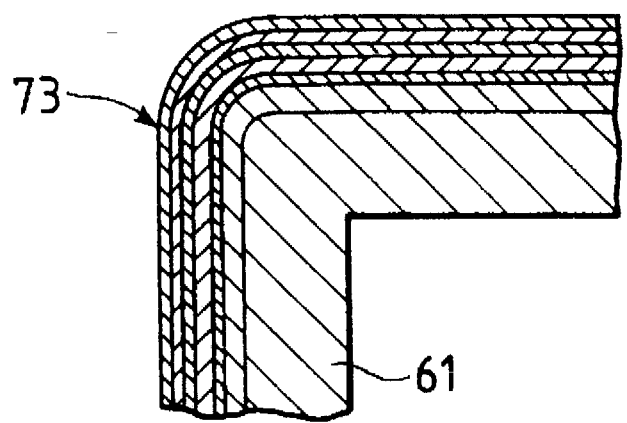

In the plastic work after the insulating base material 61 is plasticized by adding water, in the aforementioned process for producing the wiring substrate or multilayer wiring substrate, a V-shaped notch 75 as shown in FIGS. 17(a) and 17(b) may be formed in the insulating base material in advance so that the generation of stress at the time of the plastic work can be increased as sufficiently as possible and so that a relatively sharp-angle curve portion 23 can be formed.

According to the present invention, the sheet-like insulating base material used as a base material of the wiring substrate is made of hydrophilic high molecules capable of being plasticized when the hydrophilic high molecules absorb water and capable of being hardened when they are dried. Accordingly, not only plastic work such as bending, drawing, or the like, can be made through the water absorbing of the base material, in the same manner as in the case where a metal sheet is used as a base material, but also the concentration of stress in the curve portion formed can be reduced greatly. Furthermore, the insulating resin layer disposed between the insulating base material and the electrically conductive circuit is partly impregnated in the surface of the insulating base material at the time of the production of the wiring substrate to thereby attain so-called anchor effect. Accordingly, there is no possibility of separation of the electrically conductive circuit from the insulating base material at the time of the plastic work. In addition, the base material is made of an insulating material. Accordingly, perforating work to form feedthrough holes for mounting electronic parts or other holes can be carried out very easily compared with the case where a metal sheet is used as a base material.

The wiring substrate and the process of producing the same according to the present invention will be described more specifically with reference to the following examples 6–7.

EXAMPLE 6

Figure 18:
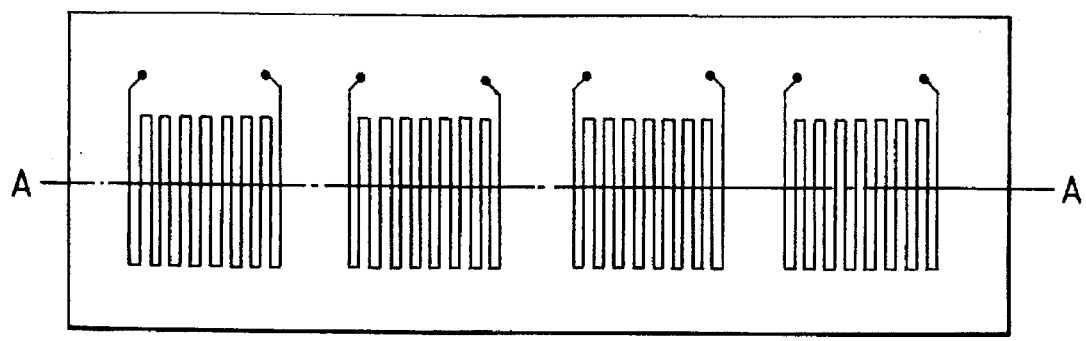
FIG. 18 is an explanatory view showing a pattern of an electrically conductive circuit employed in the wiring substrate of the present invention.

A laminate (tradename: AMIFLEX, products number P-96B produced by DAISO Inc.) constituted by 35 μm-thick copper foil and a 65 μm-thick half-hardened insulating resin sheet formed by impregnating aromatic polyamide fiber nonwoven fabric with a diallyl phthalate resin composition was used. After the copper foil was degreased by Freon, a circuit pattern as shown in FIG. 18 was printed on the copper foil by a screen printing method using alkali-soluble acid-resistant ink (products number X-77, produced by TAIYO INK MFG. Co., Ltd.). After natural drying for 24 hours, the copper foil was etched by using a ferric chloride solution. Then, the resist was separated by using a 2.4% by weight of sodium hydroxide solution. After the solution was neutralized by using a 0.61% by weight of sulfuric acid solution, the copper foil was washed with water and dried under reduced pressure. Thus, ten laminates (samples) each having an electrically conductive circuit and a half-hardened insulating resin sheet were prepared. The electric resistance of the electrically conductive circuit formed in each laminate was measured at four locations. As a result, the mean resistance value was $0.491\Omega$.

Then, the respective laminate with its electrically conductive circuit upward was piled up on 170 mm×65 mm×0.5 mm vulcanized fiber (tradename: FR-781, produced by HOKUETSU PAPER MILLS, Ltd.), heated and pressed under the conditions of 160° C., 70 kg/cm$^2$.G and 5 minutes and then pressure-stuck under application of heat and pressure under the conditions of 120° C., 70 kg/cm$^2$.G and 60 minutes to harden the half-hardened resin of the half-hardened insulating resin sheet and at the same time unite the laminate with the vulcanized fiber into one body. Then, perforating work was applied to predetermined positions thereof.

Each final laminate thus prepared was immersed in water in a water tank and left at an ordinary temperature for 30 minutes to add water to the vulcanized fiber. The mean weight before addition of water was 8.2 g. The mean weight after addition of water was 10.4 g. The water content was within the range of from 14 to 26% by weight.

Of the ten final laminates after the water adding treatment, five laminates with the electrically conductive circuits inward and the residual five laminates with the electrically conductive circuits outward were subjected to bending and drying treatment under the conditions of 100° C. and 2 hours while each bent shape was kept in the bending radius of 7 mm along the line A—A in FIG. 18.

The electric resistance of the electrically conductive circuit in each wiring substrate thus obtained was measured at the four locations. As a result, the variation of the mean resistance value was not more than 1%. All of the electrically conductive circuits showed no broken point.

EXAMPLE 7

Figure 19A:
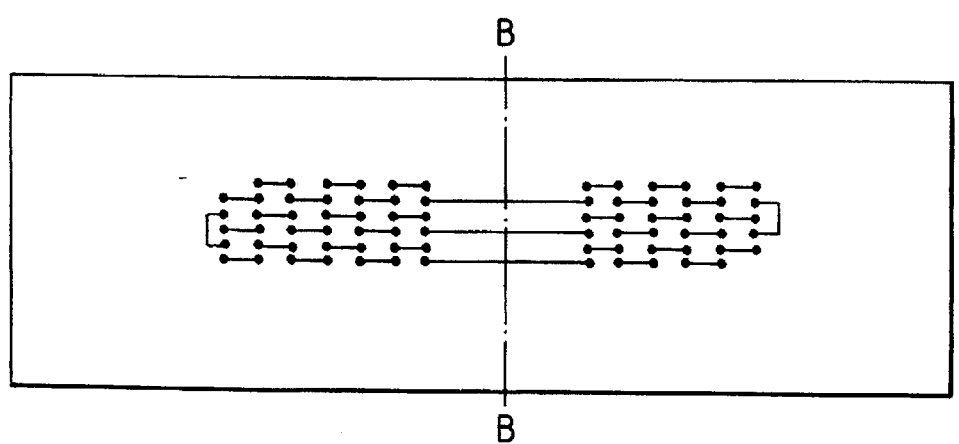
FIGS. 19(a) and 19(b) are explanatory views respectively showing patterns of upper- and lower-layer electrically conductive circuits employed in the wiring substrate of the present invention.

Laminated matters each constituted by an electrically conductive circuit having a first-layer pattern as shown in FIG. 19(a) and a half-hardened insulating resin sheet were prepared in the same manner as in Example 6. Each laminate was piled up on 0.51 mm-thick aromatic polyamide fiber nonwoven fabric (tradename: NOMEX, products number 410, produced by Du Pont Japan Ltd.) and pressure-stuck under application of heat and pressure under the conditions of 160° C., 70 kg/cm$^2$.G and 60 minutes to harden the half-hardened resin of the half-hardened insulating resin sheet and at the same time unite the laminate with the aromatic polyamide fiber nonwoven fabric into one body.

Figure 19B:
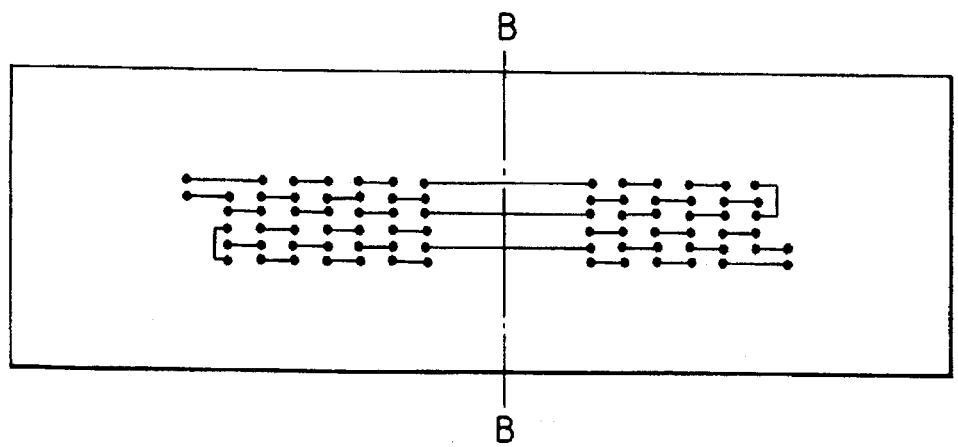

Then, perforating work was applied to predetermined positions thereof. At the same time, laminates each constituted by an electrically conductive circuit having a second-layer pattern as shown in FIG. 19(b) and a half-hardened insulating resin sheet were prepared in the same manner as described above. Each second-layer laminate was piled up on the first-layer laminate united with the aromatic polyamide fiber nonwoven fabric. The laminates thus piled up were pressure-stuck under application of heat and pressure under the conditions of 160° C., 30 kg/cm$^2$.G and 30 minutes to harden the half-hardened insulating resin sheet of the second-layer laminate and at the same time unite the upper and lower, two-layer laminates with the aromatic polyamide fiber nonwoven fabric into one body. Thus, final laminates were prepared.

Electrically conductive paste (tradename: E-1000, produced by MITSUI MINING & SMELTING Co., Ltd.) was filled in the through holes formed in the upper-layer laminate of each final laminate and hardened under the conditions of 160° C. and 30 minutes to thereby form electrically connection portions for electrically connecting the upper- and lower-layer laminates to each other. The electric resistance of the respective electrically conductive circuit was measured at two locations. As a result, the mean resistance value was $0.65\Omega$.

Then, each final laminate was immersed in water for 24 hours in the same manner as in Example 6 to add water to the aromatic polyamide fiber nonwoven fabric. The mean weight before addition of water was 8.1 g. The mean weight after addition of water was 9.62 g. The water content was within the range of from 15 to 24% by weight.

Of the ten final laminates after the water adding treatment, five laminates with the electrically conductive circuits inward and the residual five laminates with the electrically conductive circuits outward were subjected to bending and drying treatment under the conditions of 100° C. and 2 hours while the bending shape was kept in the bending radius of 7 mm along the line B—B in FIGS. 19(a) and 19(b).

The electric resistance of the electrically conductive circuit in the respective wiring substrate thus obtained was measured at the two locations. As a result, the change of the mean resistance value was not more than 1%. All of the electrically conductive circuits showed no broken point.

The wiring substrate of the present invention is light in weight and excellent in reliability upon insulation. Further, the wiring substrate can be plasticized so as to be in accord with the shape of the substrate packing space required by various electronic appliances. Furthermore, the wiring substrate can have a curve portion formed by bending, drawing or any other means, so that the shape of the wiring substrate can be changed to accord with the shape of the substrate packing space in electronic appliances. In short, the wiring substrate can respond to the demands for reduction of size, reduction of weight, reduction of thickness, and the like, in electronic appliances. In addition, according to the process of the invention, the wiring substrate having the aforementioned advantages can be produced easily.

What is claimed is:

1. A multilayer printed-circuit device, comprising:
    a flexible first substrate including:
        a first insulating resin layer having a first throughhole and having first and second surfaces, said second surface becoming adherent under application of heat and pressure, and
        a first metallic layer provided on the first surface of said first insulating resin layer and formed into a predetermined circuit pattern;
    a second substrate including:
        a second insulating resin layer,
        a second metallic layer provided on a surface of said second insulating resin layer and formed into a predetermined circuit pattern; and a blackening-treated film provided on a surface of said second metallic layer; and an electrically conductive material filled in said first throughhole of said first insulating resin layer to electrically connect said first metallic layer to said second metallic layer;

wherein the second surface opposite said first surface of said first insulating resin layer, upon application of heat and pressure, adheres to said blackening-treated film of said second substrate; and wherein said blackening-treated film is omitted from a portion of said second metallic layer surface exposed to said first throughhole of said first insulating resin layer.

2. A multilayer printed-circuit device as claimed in claim 1, wherein said second substrate includes a metal sheet on which said second insulating resin layer is disposed.

3. A multilayer printed-circuit device as claimed in claim 1, wherein said first insulating resin layer includes another throughhole and said second insulating resin layer includes a second throughhole, said another throughhole of said first insulating resin layer being aligned with said second throughhole of said second insulating resin layer.

4. A multilayer printed-circuit device, comprising:

a rigid element including:
  a rigid insulating substrate,
  a first metallic layer provided on a front surface of said rigid insulating substrate and formed into a predetermined circuit pattern,
  a second metallic layer provided on a back surface of said rigid insulating substrate and formed into a predetermined circuit pattern,
  a first blackening-treated film provided on said first metallic layer, and
  a second blackening-treated film provided on said second metallic layer;

a first substrate including:
  a first insulating resin layer having first and second surfaces, said second surface becoming adherent under application of heat and pressure,
  a third metallic layer provided on the first surface of said first insulating resin layer and formed into a predetermined circuit pattern, and
  a first throughhole passing through said first insulating resin layer;

a second substrate including:
  a second insulating resin layer having first and second surfaces, said second surface becoming adherent under application of heat and pressure,
  a fourth metallic layer provided on the first surface of said second insulating resin layer and formed into a predetermined circuit pattern, and
  a second throughhole passing through said second insulating resin layer;

a first electrically conductive material filled in said first throughhole to electrically connect said third metallic layer of said first substrate to said first metallic layer of said rigid insulating substrate; and a second electrically conductive material filled in said second throughhole to electrically connect said fourth metallic layer of said second substrate to said second metallic layer of said rigid insulating substrate;

wherein the second surface of said first insulating resin layer, upon application of heat and pressure, adheres to said first blackening-treated film of said rigid insulating substrate, wherein the second surface of said second insulating resin layer, upon application of heat and pressure, adheres to said second blackening-treated film of said rigid element, wherein said first blackening-treated film of said rigid element is omitted from a portion of said first metallic layer exposed to said first throughhole of said first printed circuit, and wherein said second blackening-treated film of said rigid element is omitted from a portion of said second metallic layer exposed to said second throughhole of said second substrate.

5. A multilayer printed-circuit device as claimed in claim 4, wherein said rigid insulating substrate includes a common throughhole, and a plating layer provided on said common throughhole.

6. A multilayer printed-circuit device as claimed in claim 5, wherein said first substrate includes another throughhole passing through said first insulating resin layer, and said second substrate includes another throughhole passing through said second insulating resin layer, said another throughhole portion of said first substrate, said another throughhole portion of said second substrate, and said common throughhole being aligned with each other.

* * * * *